(12) United States Patent
Fukatsu et al.

(10) Patent No.: US 12,033,922 B2
(45) Date of Patent: Jul. 9, 2024

(54) SEMICONDUCTOR DEVICE AND ELECTRONIC DEVICE

(71) Applicant: DENSO CORPORATION, Kariya (JP)

(72) Inventors: Akihiro Fukatsu, Kariya (JP); Noboru Nagase, Kariya (JP); Toshihiro Nagaya, Kariya (JP)

(73) Assignee: DENSO CORPORATION, Kariya (JP)

( * ) Notice: Subject to any disclaimer, the term of this patent is extended or adjusted under 35 U.S.C. 154(b) by 399 days.

(21) Appl. No.: 17/557,138

(22) Filed: Dec. 21, 2021

(65) Prior Publication Data

US 2022/0115302 A1    Apr. 14, 2022

Related U.S. Application Data

(63) Continuation of application No. PCT/JP2020/021511, filed on Jun. 1, 2020.

(30) Foreign Application Priority Data

Jul. 10, 2019  (JP) .................................. 2019-128733

(51) Int. Cl.
*H01L 23/495*   (2006.01)
*H01L 23/00*   (2006.01)
(Continued)

(52) U.S. Cl.
CPC .. *H01L 23/49537* (2013.01); *H01L 23/49575* (2013.01); *H01L 25/072* (2013.01); *H01L 25/162* (2013.01); *H02M 1/08* (2013.01); *H02M 7/537* (2013.01); *H05K 1/181* (2013.01); *H01L 23/3121* (2013.01); *H01L 23/49513* (2013.01); *H01L 24/32* (2013.01); *H01L 24/37* (2013.01); *H01L 24/40* (2013.01); *H01L 24/48* (2013.01);
(Continued)

(58) Field of Classification Search
None
See application file for complete search history.

(56) References Cited

U.S. PATENT DOCUMENTS 6,316,922 B1    11/2001  Sugahara et al.
2002/0093094 A1   7/2002  Takagawa et al.
(Continued)

OTHER PUBLICATIONS

U.S. Appl. No. 17/557,165, filed Dec. 21, 2021, Igoshi.

*Primary Examiner* — Nishath Yasmeen
(74) *Attorney, Agent, or Firm* — Posz Law Group, PLC

(57) ABSTRACT

A semiconductor device includes: first and second semiconductor elements each having two electrodes respectively disposed on two surfaces; two first terminals respectively connected to the two electrodes of the first semiconductor element and arranged side by side in one direction; two second terminals respectively connected to the two electrodes of the second semiconductor element, and arranged side by side in the one direction to be adjacent to the two first terminals; and a sealing resin portion covering the first and second semiconductor elements and the first and second terminals in a state where facing surfaces of the first and second terminals are exposed from the sealing resin portion. The facing surfaces of the two first terminals have different area ratios, the facing surfaces of the two second terminals have different area ratios, and one of the first terminals is arranged adjacent to both the two second terminals.

12 Claims, 17 Drawing Sheets

(51) Int. Cl.
  *H01L 23/31* (2006.01)
  *H01L 25/07* (2006.01)
  *H01L 25/16* (2023.01)
  *H02M 1/08* (2006.01)
  *H02M 7/537* (2006.01)
  *H02P 27/06* (2006.01)
  *H05K 1/18* (2006.01)

(52) U.S. Cl.
  CPC .... *H01L 24/73* (2013.01); *H01L 2224/32245* (2013.01); *H01L 2224/37147* (2013.01); *H01L 2224/3716* (2013.01); *H01L 2224/40175* (2013.01); *H01L 2224/40499* (2013.01); *H01L 2224/48245* (2013.01); *H01L 2224/73221* (2013.01); *H01L 2224/73263* (2013.01); *H01L 2924/01029* (2013.01); *H01L 2924/01047* (2013.01); *H01L 2924/0105* (2013.01); *H01L 2924/01082* (2013.01); *H01L 2924/014* (2013.01); *H01L 2924/10253* (2013.01); *H01L 2924/10272* (2013.01); *H01L 2924/13055* (2013.01); *H01L 2924/13091* (2013.01); *H01L 2924/1433* (2013.01); *H02P 27/06* (2013.01); *H05K 2201/10015* (2013.01); *H05K 2201/10166* (2013.01)

(56) References Cited

U.S. PATENT DOCUMENTS

| | | |
|---|---|---|
| 2004/0135248 A1 | 7/2004 | Takagawa et al. |
| 2005/0218489 A1 | 10/2005 | Satou et al. |
| 2007/0145580 A1 | 6/2007 | Satou et al. |
| 2009/0218683 A1 | 9/2009 | Satou et al. |
| 2010/0141229 A1 | 6/2010 | Satou et al. |
| 2011/0273154 A1 | 11/2011 | Satou et al. |
| 2012/0139130 A1 | 6/2012 | Satou et al. |
| 2013/0203217 A1 | 8/2013 | Satou et al. |
| 2014/0003002 A1 | 1/2014 | Satou et al. |
| 2014/0312510 A1 | 10/2014 | Satou et al. |
| 2018/0226389 A1* | 8/2018 | Kimura ............... H01L 24/26 |
| 2019/0181078 A1* | 6/2019 | Yamamoto ........ H01L 23/49575 |

* cited by examiner

FIG. 15

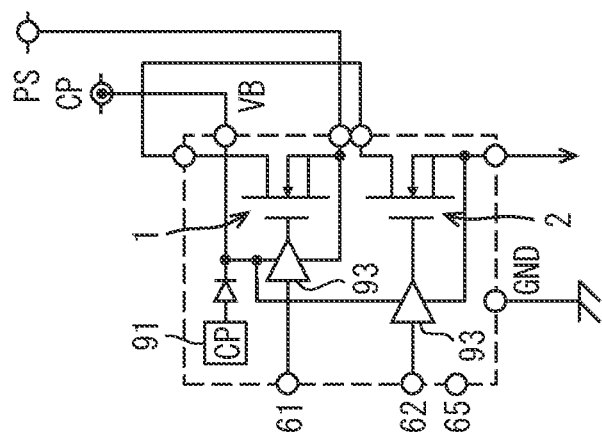
FIG. 16C
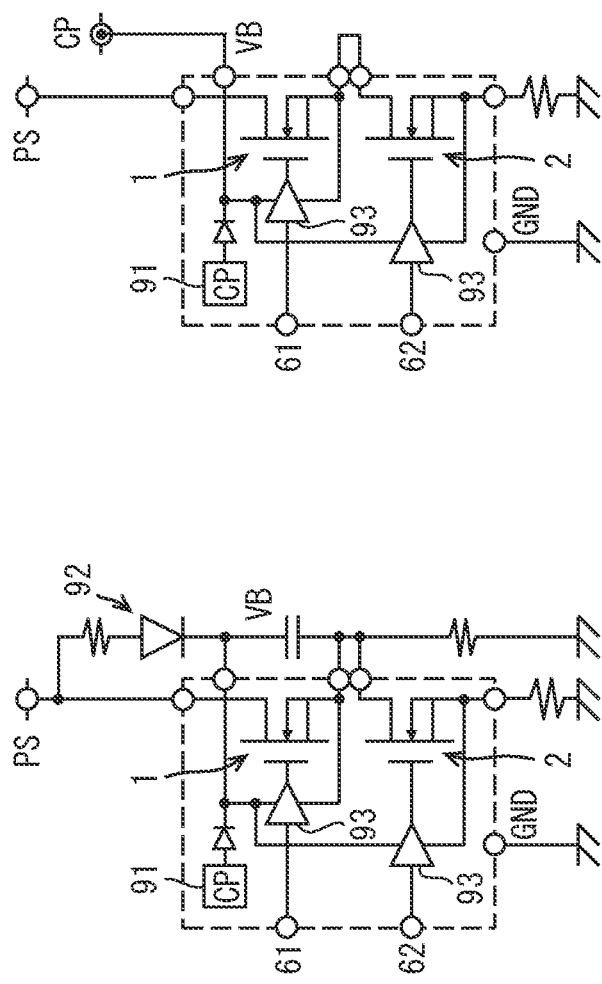
FIG. 16B
FIG. 16A

SEMICONDUCTOR DEVICE AND ELECTRONIC DEVICE

CROSS REFERENCE TO RELATED APPLICATIONS

The present application is a continuation application of International Patent Application No. PCT/JP2020/021511 filed on Jun. 1, 2020, which designated the U.S. and claims the benefit of priority from Japanese Patent Application No. 2019-128733 filed on Jul. 10, 2019. The entire disclosures of all of the above applications are incorporated herein by reference.

TECHNICAL FIELD

The present disclosure relates to a semiconductor device and an electronic device including the semiconductor device.

BACKGROUND

Conventionally, a semiconductor device including two semiconductor elements has been known.

SUMMARY

The present disclosure provides a semiconductor device and an electronic device including the semiconductor device. The semiconductor device includes: first and second semiconductor elements each having two electrodes respectively disposed on two surfaces; two first terminals respectively connected to the two electrodes of the first semiconductor element and arranged side by side in one direction; two second terminals respectively connected to the two electrodes of the second semiconductor element, and arranged side by side in the one direction to be adjacent to the two first terminals; and a sealing resin portion covering the first and second semiconductor elements and the first and second terminals in a state where facing surfaces of the first and second terminals are exposed from the sealing resin portion. The facing surfaces of the two first terminals have different area ratios, the facing surfaces of the two second terminals have different area ratios, and one of the first terminals is arranged adjacent to both the two second terminals.

BRIEF DESCRIPTION OF DRAWINGS

Objects, features and advantages of the present disclosure will become apparent from the following detailed description made with reference to the accompanying drawings. In the drawings:

FIG. 15 is a plan view showing a schematic configuration of a semiconductor device according to a second modification;

FIG. 16A is a diagram showing an equivalent circuit of an example in which the semiconductor device is applied to an inverter configuration device and provided with a boot strap circuit;

FIG. 16B is a diagram showing an equivalent circuit of an example in which the semiconductor device is applied to an inverter configuration device and is provided with a charge pump circuit;

FIG. 16C is a diagram showing an equivalent circuit of an example in which the semiconductor device is applied to a relay configuration device and is provided with a charge pump circuit;

DETAILED DESCRIPTION

Figure 1:
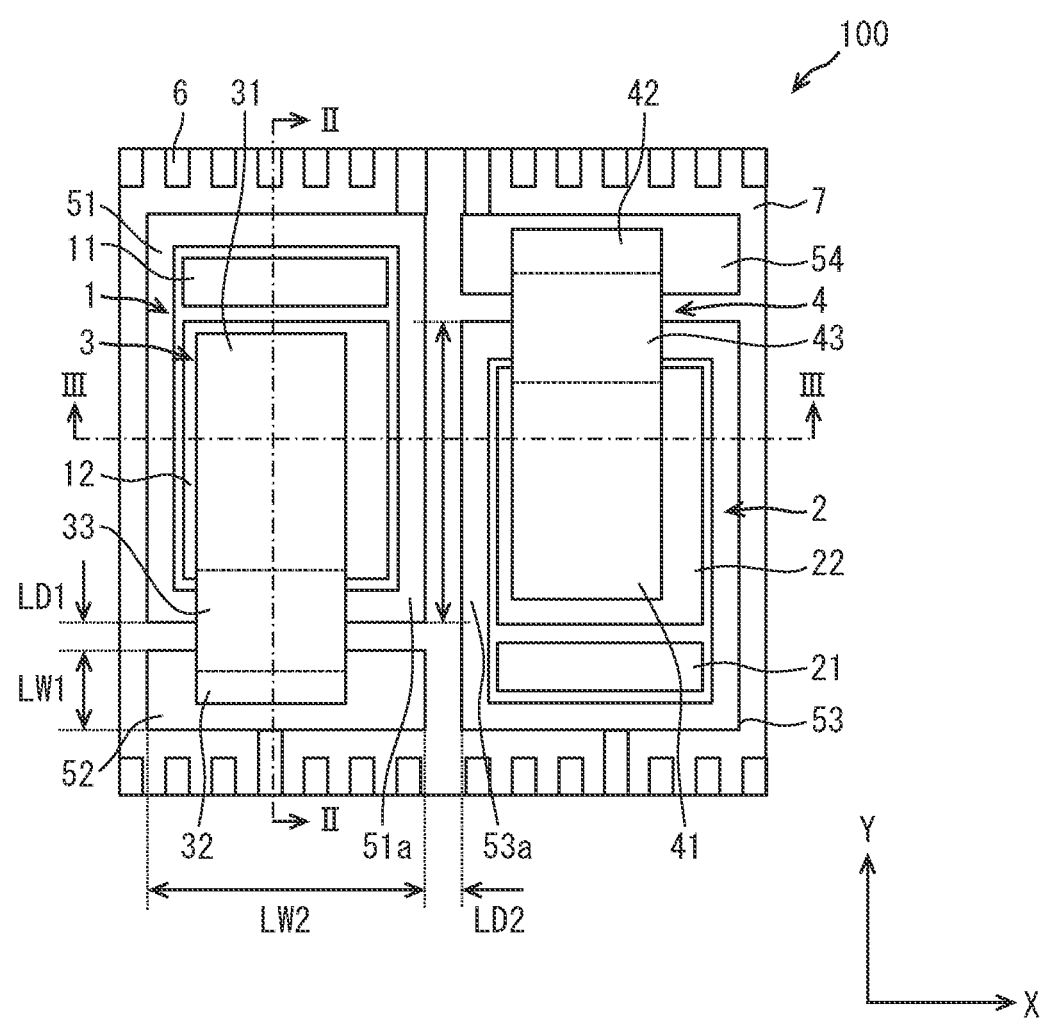
FIG. 1 is a plan view showing a schematic configuration of a semiconductor device according to a first embodiment.

A semiconductor device according to a comparative example includes a composite power metal oxide semiconductor field effect transistor (MOSFET) that forms a DC-DC converter, a high-side power MOSFET is composed of a lateral MOSFET, and a low-side power MOSFET is composed of a vertical MOSFET.

In the above semiconductor device, two semiconductor elements are configured in the same shape. Therefore, it is difficult to use the semiconductor elements as switching elements for an inverter or a semiconductor relay. In addition, in products that handle large currents, a wiring area and a width become large, and it becomes more difficult to achieve both.

A semiconductor device according to a first aspect of the present disclosure is configured to be mountable on a wiring board having wiring, and includes a first semiconductor element, a second semiconductor element, two first terminals, two second terminals, and a sealing resin portion. The first semiconductor element has two electrodes respectively disposed on two surfaces of the first semiconductor element. The second semiconductor element has two electrodes respectively disposed on two surfaces of the second semiconductor element. The two first terminals are configured to be connected to a part of the wiring in a state of being mounted on the wiring board, electrically connected to the two electrodes of the first semiconductor element, respectively, and arranged side by side in one direction. The two second terminals are configured to be connected to another part of the wiring in the state of being mounted on the wiring board, electrically connected to the two electrodes of the second semiconductor element, respectively, and arranged side by side in the one direction to be adjacent to the two first terminals. The sealing resin portion covers the first semiconductor element, the second semiconductor element, the first terminals, and the second terminals in a state where facing surfaces of the first terminals and the second terminals are exposed from the sealing resin portion. The facing surfaces of the first terminals and the second terminals face the wiring board in the state of being mounted on the wiring board. The facing surfaces of the two first terminals have area ratios different from each other. The facing surfaces of the two second terminals have area ratios different from each other. One of the first terminals is arranged adjacent to both the two second terminals.

In the semiconductor device according to the first aspect, the first terminals and the second terminals are configured as described above. Therefore, in the semiconductor device according to the first aspect, the semiconductor elements can be used as switching elements for an inverter or a semiconductor relay depending on a connection point between the wiring of the wiring board and each of the first terminals and the second terminals while suppressing the increase in size.

An electronic device according to a second aspect of the present disclosure includes the semiconductor device according to the first aspect and a wiring board on which the semiconductor device is mounted and having wiring connected to the two first terminals and the two second terminals.

The electronic device according to the second aspect can exhibit the same effects as those of the first aspect.

Hereinafter, multiple embodiments of the present disclosure will be described with reference to the drawings. In each embodiment, portions corresponding to those described in the preceding embodiment are denoted by the same reference numerals, and redundant descriptions will be omitted in some cases. In each embodiment, in a case where only a part of the configuration is described, another preceding embodiment can be referenced to and applied to the other parts of the configuration. Hereinafter, three directions perpendicular to each other are denoted as an X direction, a Y direction, and a Z direction.

First Embodiment

Figure 2:
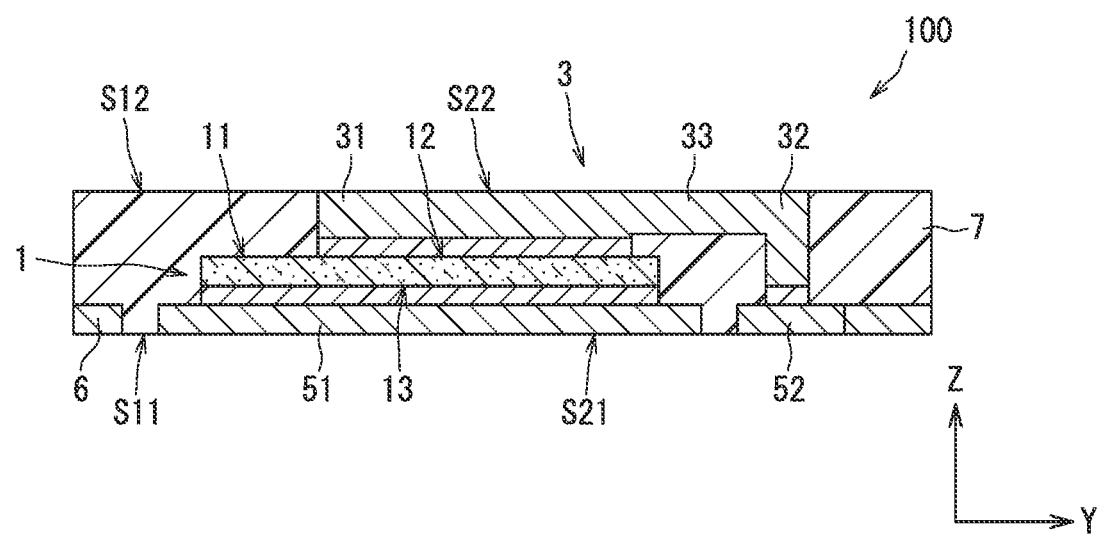
FIG. 2 is a cross-sectional view of the semiconductor device taken along line II-II in FIG. 1.
Figure 3:
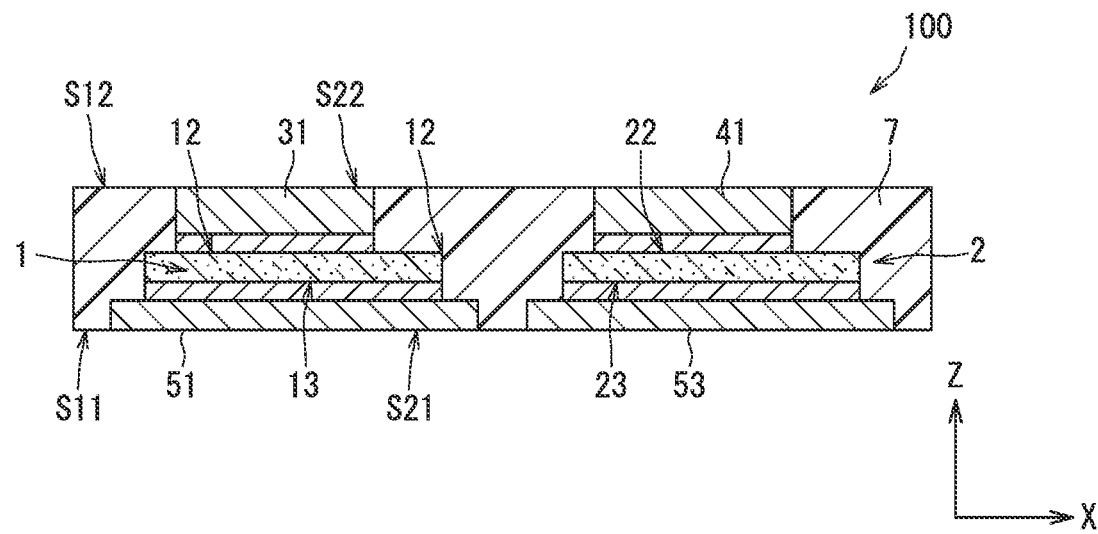
FIG. 3 is a cross-sectional view of the semiconductor device taken along line III-III in FIG. 1.

A semiconductor device 100 according to a first embodiment of the present disclosure will be described with reference to FIGS. 1 to 8B. As shown in FIGS. 1, 2, and 3, the semiconductor device 100 includes two semiconductor elements, that is, a first semiconductor element 1 and a second semiconductor element 2, two lead frames, and two clips 3 and 4, and sealing resin portion 7. The semiconductor device 100 is configured to be mountable on a printed circuit board 200 having wires 210 and 220. The wires 210 and 220 may be referred to as wiring. The printed circuit board 200 corresponds to a wiring board. A structure including the semiconductor device 100 and the printed circuit board 200 on which the semiconductor device 100 is mounted corresponds to an electronic device.

In FIG. 1, a part of the sealing resin portion 7 is omitted in order to simplify the drawing and make each component easy to understand. That is, in FIG. 1, the portion of the sealing resin portion 7 that covers the two semiconductor elements 1 and 2, the two lead frames, and the two clips 3 and 4 is omitted.

On both sides of each of the semiconductor elements 1 and 2, electrodes are formed. As an example, a metal-oxide semiconductor field-effect transistor (MOSFET) is adopted as each of the semiconductor elements 1 and 2. However, the present disclosure is not limited to this example, and an insulated gate bipolar transistor (IGBT) or the like can also be adopted as each of the semiconductor elements 1 and 2. As another example, a reverse conduction (RC)-IGBT in which an IGBT and a diode are integrated can also be adopted as an each of the semiconductor elements 1 and 2. Further, as each of the semiconductor elements 1 and 2, for example, a semiconductor element having Si as a main component or a semiconductor element having SiC as a main component can be adopted.

As shown in FIGS. 1, 2, and 3, the first semiconductor element 1 includes a first substrate having a front surface and a rear surface opposite from each other, a first drain electrode 13 exposed on the rear surface of the first substrate, a first source electrode 12 and a first gate electrode 11 exposed on the front surface of the first substrate. The first drain electrode 13 is formed on substantially the entire area of the front surface of the first substrate. On the other hand, the first gate electrode 11 and the first source electrode 12 are partially formed on the rear surface of the semiconductor substrate.

The first substrate has, for example, a rectangular shape in an XY plane and has a thickness in the Z direction. In the present embodiment, as an example, the first substrate in which the Y direction is a longitudinal direction and the X direction is a lateral direction is adopted.

The first semiconductor element 1 may be formed with a temperature sensor, a current sensor, or the like. In this case, in the first semiconductor element 1, a pad electrically connected to the temperature sensor or the current sensor is formed on the same surface as the first gate electrode 11 and the first source electrode 12. Further, the pad is arranged side by side with the first gate electrode 11 in the X direction, for example.

The second semiconductor element 2 includes a second substrate, a second drain electrode 23 exposed on a rear surface of the second substrate, and a second source electrode 22 and a second gate electrode 21 exposed on a front surface of the second substrate. The second semiconductor element 2 has a structure similar to the first semiconductor element 1. Therefore, regarding the second semiconductor element 2, the description of the first semiconductor element 1 can be referred to.

The first drain electrode 13 and the second drain electrode 23 correspond to rear surface electrodes. The first source electrode 12 and the second source electrode 22 correspond to front surface electrodes.

In the semiconductor device 100, the first semiconductor element 1 and the second semiconductor element 2 are arranged in opposite directions. That is, the first semiconductor device 100 is arranged so that the arrangement direction of the first gate electrode 11 and the first source electrode 12 is opposite to the arrangement direction of the second gate electrode 21 and the second source electrode 22.

The two lead frames include a first lead frame for the first semiconductor element 1 and a lead frame for the second semiconductor element 2. The first lead frame has a first drain terminal 51, a first source terminal 52, and an external connection terminal 6. The first drain terminal 51 and the first source terminal 52 correspond to two first terminals. The first lead frame may contain a conductive material as a main component. The conductive material is a metallic material such as Cu, Fe, or an alloy thereof. The first drain terminal 51, the first source terminal 52, and the external connection terminal 6 are separated from each other.

Each of the terminals 51, 52, and 6 is a plate-shaped member. Further, each of the terminals 51, 52, and 6 has a rectangular surface along the XY plane. Each of the terminals 51, 52, and 6 has sidewalls perpendicular to the XY plane. Therefore, in the first drain terminal 51, the area of one surface on which the first semiconductor element 1 is mounted and the area of the surface opposite to the one surface are substantially the same, but may be different. This is the same for the other terminals 52 and 6.

As shown in FIGS. 2 and 3, the first semiconductor element 1 is mounted on a mounting surface of the first drain terminal 51. More specifically, the first drain terminal 51 is a portion where the first semiconductor element 1 is mounted and the first drain electrode 13 is electrically connected. The first drain terminal 51 is electrically connected to the first drain electrode 13 via a conductive connecting member such as solder. Therefore, the first semiconductor element 1 is mounted on the first drain terminal 51 by electrically connecting the first drain electrode 13 and the first drain terminal 51 via the conductive connecting member. In the present embodiment, solder is used as the conductive connecting member. The first drain terminal 51 corresponds to a first rear surface terminal.

As shown in FIG. 2, the first source terminal 52 is electrically connected to the first source electrode 12 via a first clip 3 described later. In this way, the first source terminal 52 is not mounted with the first semiconductor element 1, and is electrically connected to the first semiconductor element 1 (first source electrode 12) via the first clip 3. The first source terminal 52 corresponds to a first front surface terminal. In this way, the first drain terminal 51 and the first source terminal 52 are electrically connected to the electrodes 13 and 12 of the first semiconductor element 1.

The first lead frame has a first terminal surface S21 that is the opposite surface of the mounting surface of the first semiconductor element 1 in the first drain terminal 51 and the opposite surface of the connection surface of the first clip 3 in the first source terminal 52. The first terminal surface S21 corresponds to a facing surface.

The first terminal surface S21 is exposed from the sealing resin portion 7 described later. Therefore, the first drain terminal 51 and the first source terminal 52 have a function as a heat sink for radiating heat generated from the first semiconductor element 1 in addition to the function as an electric wiring. Therefore, the first terminal surface S21 can be said to be a heat dissipation surface. In the first drain terminal 51 and the first source terminal 52, the portion exposed from the sealing resin portion 7 is connected to a part of the wires 210 and 220 in a state where the semiconductor device 100 is mounted on the printed circuit board 200.

As the mounting surface, the connecting surface, and the first terminal surface S21, for example, a flat surface can be adopted. Further, the first terminal surface S21 of the first drain terminal 51 and the first terminal surface S21 of the first source terminal 52 are configured to be flush with each other.

Further, as shown in FIG. 1, the first drain terminal 51 and the first source terminal 52 are arranged side by side in one direction. In the present embodiment, an example in which the first drain terminal 51 and the first source terminal 52 are arranged side by side in the Y direction is adopted. The area ratio of the first terminal surface S21 is different between the first drain terminal 51 and the first source terminal 52. That is, the first drain terminal 51 and the first source terminal 52 have different surface areas along the XY plane. The first terminal surface S21 of the first drain terminal 51 is wider than the first terminal surface S21 of the first source terminal 52.

The second lead frame has a second drain terminal 53, a second source terminal 54, and an external connection terminal 6. The target of the second lead frame to be connected and mounted is the second semiconductor element 2, but the configuration is similar to that of the first lead frame. Therefore, regarding the second lead frame, the description of the first lead frame can be referred to. For example, as shown in FIG. 1, the second drain terminal 53 and the second source terminal 54 are arranged side by side in one direction, and the area ratio of the first terminal surface S21 is different. That is, the second drain terminal 53 and the second source terminal 54 have different surface areas along the XY plane. The first terminal surface S21 of the second drain terminal 53 is wider than the first terminal surface S21 of the second source terminal 52.

The second drain terminal 53 corresponds to a second rear surface terminal. The second source terminal 54 corresponds to a second front surface terminal. Further, the present embodiment adopts the semiconductor device 100 in which a part of the first drain terminal 51 protrudes to a position adjacent to the external connection terminal 6, and a part of the second source terminal 54 protrudes to a position adjacent to the external connection terminal 6.

In the first source terminal 52, the width in the Y direction is defined as a first terminal width LW1, and the width in the X direction is defined as a second terminal width LW2. The width of the first drain terminal 51 in the Y direction is longer than the first terminal width LW1, and the width of the first drain terminal 51 in the X direction is the same as the second terminal width LW2.

On the other hand, the width of the second source terminal 54 in the Y direction is the same as the first terminal width LW1, and the width of the second source terminal 54 is the same as the second terminal width LW2. The width of the second drain terminal 53 in the Y direction is longer than the first terminal width LW1, and the width of the second drain terminal 53 in the X direction is the same as the second terminal width LW2. Further, the width of the second drain terminal 53 in the Y direction is the same as the width of the first drain terminal 51 in the Y direction.

A first distance LD1, which is a distance between the first drain terminal 51 and the first source terminal 52, is narrower than the width of the first drain terminal 51 in the Y direction and the width of the first source terminal 52 in the Y direction. That is, the first distance LD1 is narrower than the first terminal width LW1. An distance between the second drain terminal 53 and the second source terminal 54 described below is the same as that of the first distance LD1. The relationship between the distance between the second drain terminal 53 and the second source terminal 54 and the width of the second drain terminal 53 and the second source terminal 54 in the Y direction is the same as relationship determined in the first drain terminal 51 and the first source terminal 52.

Further, a second distance LD2, which is a distance between the first source terminal 52 and the second drain terminal 53, is narrower than the second terminal width LW2. The distance between the first drain terminal 51 and the second drain terminal 53 and the distance between the first drain terminal 51 and the second source terminal 54 are the same as the second distance LD2.

The first lead frame and the second lead frame have multiple external connection terminals 6. That is, the first lead frame has multiple external connection terminals 6. Similarly, the second lead frame has multiple external connection terminals 6. The external connection terminals 6 are arranged side by side in the X direction.

The external connection terminals 6 of the first lead frame are electrically connected to the first gate electrode 11 via wires (not shown). Similarly, the external connection terminals 6 of the second lead frame are electrically connected to the second gate electrode 21 via wires. The external connection terminals 6 includes a terminal electrically connected to a pad electrically connected to a temperature sensor or a current sensor.

Further, as shown in FIG. 1, the first drain terminal 51 is arranged adjacent to both the second drain terminal 53 and the second source terminal 54. That is, the first drain terminal 51 is adjacent to both the second drain terminal 53 and the second source terminal 54 in the X direction. Similarly, the second drain terminal 53 is adjacent to both the first drain terminal 51 and the first source terminal 52 in the X direction. Therefore, the first drain terminal 51 has a first overlap portion 51a facing the second drain terminal 53. On the other hand, the second drain terminal 53 has a second overlap portion 53a facing the first drain terminal 51.

In the semiconductor device 100, the arrangement direction of the first drain terminal 51 and the first source terminal 52 and the arrangement direction of the second drain terminal 53 and the second source terminal 54 are opposite to each other. Therefore, in the semiconductor device 100, it can be said that the terminals 51 and 52 for the first semiconductor element 1 and the terminals 53 and 54 for the second semiconductor element 2 are alternately arranged.

The first clip 3 corresponds to a first bridge member. For example, the first clip 3 may contain a conductive material such as a metal material such as Cu, Fe or an alloy thereof as a main component. As shown in FIGS. 1 and 2, the first clip 3 has a first electrode facing portion 31 facing the first source electrode 12, a first terminal facing portion 32 corresponding to the first source terminal 52, and a first connecting portion 33 connecting the electrode facing portion 31 and the first terminal facing portion 32. The first electrode facing portion 31, the first terminal facing portion 32, and the first connecting portion 33 are a block-shaped member configured as an integral body.

The first electrode facing portion 31 is electrically connected to the first source electrode 12 via solder. Similarly, the first terminal facing portion 32 is electrically connected to the first source terminal 52 via solder. In this way, in the first semiconductor element 1, the first source electrode 12 and the first source terminal 52 are electrically connected via the first clip 3. In the present embodiment, as an example, the first clip 3 which has a rectangular shape in the XY plane and has a thickness in the Z direction is adopted.

A second clip 4 corresponds to a second bridge member. The second clip 4 has a second electrode facing portion 41, a second terminal facing portion 42, and a second connecting portion 43. The second clip 4 is connected to the second semiconductor element 2, but has a configuration similar to the first clip 3. Therefore, regarding the second clip 4, the description of the first clip 3 can be referred to.

In the present disclosure, instead of the clips 3 and 4, a wire containing aluminum, copper or the like as a main component can be adopted. However, since the clips 3 and 4 have lower resistance than the wire, a large current can be passed with low loss, and a current can be passed from the entire source electrodes 12 and 22 of the semiconductor elements 1 and 2. Therefore, the semiconductor device 100 can keep the source potential constant by using the clips 3 and 4. Further, when a sense MOS is formed in each of the semiconductor elements 1 and 2, the current detection accuracy of the semiconductor device 100 is improved.

As described above, the clips 3 and 4 and the electrodes 12 and 22, and the clips 3 and 4 and the terminals 52 and 53 are connected by solder. That is, solder is used to fix these components and to pass an electric current. Therefore, it is preferable to use a material having a low resistivity for the solder. For example, as the material for the solder, SnAgCu, which is a lead-free solder, or PbSn containing lead is used. However, the present disclosure is not limited to this, and solders made of other materials can also be adopted. Furthermore, the present disclosure can also adopt Ag paste, molten Ag, or the like.

The sealing resin portion 7 contains an electrically insulating resin and a filler having a higher thermal conductivity than the electrically insulating resin as constituent materials. That is, in the sealing resin portion 7, the filler is embedded in the electrically insulating resin. As the electrically insulating resin, for example, an epoxy resin or the like can be adopted. On the other hand, as the filler, inorganic particles such as alumina can be adopted.

The sealing resin portion 7 may have electrical insulation and may have a thermal conductivity of 2.2 W or more, for example. The thermal conductivity of the sealing resin portion 7 can be adjusted depending on the amount and material of the filler. The sealing resin portion 7 is formed by, for example, injection molding using a mold.

The sealing resin portion 7 integrally covers the semiconductor elements 1 and 2, both lead frames, the clips 3 and 4, and the wire. It can be said that the sealing resin portion 7 is sealed while being in contact with them. The sealing resin portion 7 has a rectangular shape on the XY plane.

As shown in FIGS. 2 and 3, the sealing resin portion 7 has a resin surface S11 and a resin rear surface S12 opposite to the resin surface S11. For the resin front surface S11 and the resin rear surface S12, for example, a flat surface can be adopted. Further, it can be said that the resin front surface S11 and the resin rear surface S12 are formed along the XY plane.

Further, the sealing resin portion 7 covers the semiconductor elements 1 and 2, both lead frames, and the clips 3 and 4 in a state where the first terminal surfaces S21 of the drain terminals 51 and 53 and the source terminals 52 and 54 are exposed. The present embodiment adopts an example in which surfaces of the clips 3 and 4 opposite from surfaces facing the semiconductor elements 1 and 2 are exposed from the sealing resin portion 71. That is, in the first clip 3, the surface opposite from the surface facing the first gate electrode 11 and the first source electrode 12 of the first semiconductor element 1 is exposed from the sealing resin portion 7. Similarly, in the second clip 4, the surface opposite from the surface facing the second gate electrode 21 and the second source electrode 22 of the second semiconductor element 2 is exposed from the sealing resin portion 7. The resin surface S11 is configured to be flush with the first terminal surface S21.

As described above, in the semiconductor device 100, the first terminal surface S21 is exposed from the sealing resin portion 7. Therefore, the first terminal surface S21 is connected to a part of the wires 210 and 220 in a state whether the first terminal surface S21 is mounted on the printed circuit board 200. The first terminal surface S21 and the wires 210 and 220 are connected by a conductive connecting member such as solder.

Here, a manufacturing method of the semiconductor device 100 will be described. First, the semiconductor elements 1 and 2 are manufactured by a wafer process. If necessary, the wafer may be thinned. Since the semiconductor elements 1 and 2 are to be older-bonded on both sides, the semiconductor elements 1 and 2 are plated with a material that can be solder-bonded, such as nickel. After that, a wafer acceptance test (WAT) is performed to inspect the electrical characteristics in the wafer state, and the wafer is diced.

After that, solder is printed on the first lead frame, and the first semiconductor element 1 is mounted. Then, the first semiconductor element 1 and the first clip 3 are joined by soldering. Similarly, solder is printed on the second lead frame, and the second semiconductor element 2 is mounted. Then, the second semiconductor element 2 and the second clip 4 are joined by soldering. The first semiconductor element 1 and the second semiconductor element 2 may be mounted at the same time, and the first clip 3 and the second clip 4 may be mounted at the same time, or the above four components may be mounted at the same time. For solder application, thread solder may be used instead of solder printing.

After that, each of the external connection terminals 6 and the semiconductor elements 1 or 2 are connected by wire bonding. As the material of the wire, gold, copper, aluminum or the like can be adopted. Further, the connection between each of the external connection terminals 6 and the semiconductor elements 1 or 2 may be made by soldering a clip instead of the wire.

After that, the outer shape is formed by the sealing resin portion 7. Usually, multiple packages are collectively formed in the sealing resin portion 7 in order to form the multiple packages (semiconductor device 100) on both lead frames. Then, it is divided into each semiconductor device 100 by singulation. After that, the electrical characteristics are confirmed by inspection, visual inspection is carried out, and the product is shipped.

In the semiconductor device 100, the area ratio of the first terminal surface S21 in the first drain terminal 51 and the first source terminal 52 is different, and the area ratio of the first terminal surface S21 in the second drain terminal 53 and the second source terminal 54 is different. Accordingly, in the semiconductor device 100, the first drain terminal 51 is arranged adjacent to both the second drain terminal 53 and the second source terminal 54, and the second drain terminal 53 is arranged adjacent to both the first drain terminal 51 and the first source terminal 52.

Therefore, in the semiconductor device 100, each of the semiconductor elements 1 and 2 is used as a switching element for an inverter or a semiconductor relay depending on the connection points between the wires 210 and 220 of the printed circuit board 200 and the terminals 51 to 54, while suppressing the increase in size. That is, each of the semiconductor elements 1 and 2 can be used as a switching element for an inverter or a semiconductor relay while the semiconductor device 100 is formed in one package. Further, it can be said that the semiconductor device 100 can have a common package for an inverter and a semiconductor relay. Further, since a large current flows through the wires 210 and 220, the terminal widths LW1, LW2 are widened and electric resistance are reduced. In order to widen the terminal widths LW1 and LW2, the distances LD1 and LD2 are made as narrow as possible. In the semiconductor device 100, the semiconductor elements 1 and 2 may be independently configured depending on the connection points between the wires 210 and 220 of the printed circuit board 200 and the terminals 51 to 54.

Further, since the semiconductor device 100 is configured as described above, even if the occupancy rate of the first terminal surface S21 adjacent to the resin surface S11 becomes high, each of the semiconductor elements 1 and 2 can be used for a switching element for an inverter or a semiconductor relay.

Here, an example of a mounting structure of the semiconductor device 100 on the printed circuit board 200 will be described with reference to FIGS. 4 to 8B.

In the printed circuit board 200, the wires 210 and 220 are formed on an electrically insulating base member. As the base member, resin, ceramics, or the like can be adopted. Further, as the printed circuit board 200, a multilayer board in which the wires 210 and 220 are laminated via the base member and a single-layer board in which wires 210 and 220 are formed on a surface of the base member can be adopted. The wires 210 and 220 are electrically connected to the terminals 51 to 54 in a state where the semiconductor device 100 is mounted on the printed circuit board 200.

First, a case where the semiconductor device 100 is used as an inverter configuration device 100a will be described with reference to FIGS. 4 and 5. The inverter configuration device 100a has a structure similar to the semiconductor device 100. Further, in this example, the printed circuit board 200 on which a capacitor 110 is mounted is adopted. The capacitor 110 is a snubber capacitor.

Figure 4:
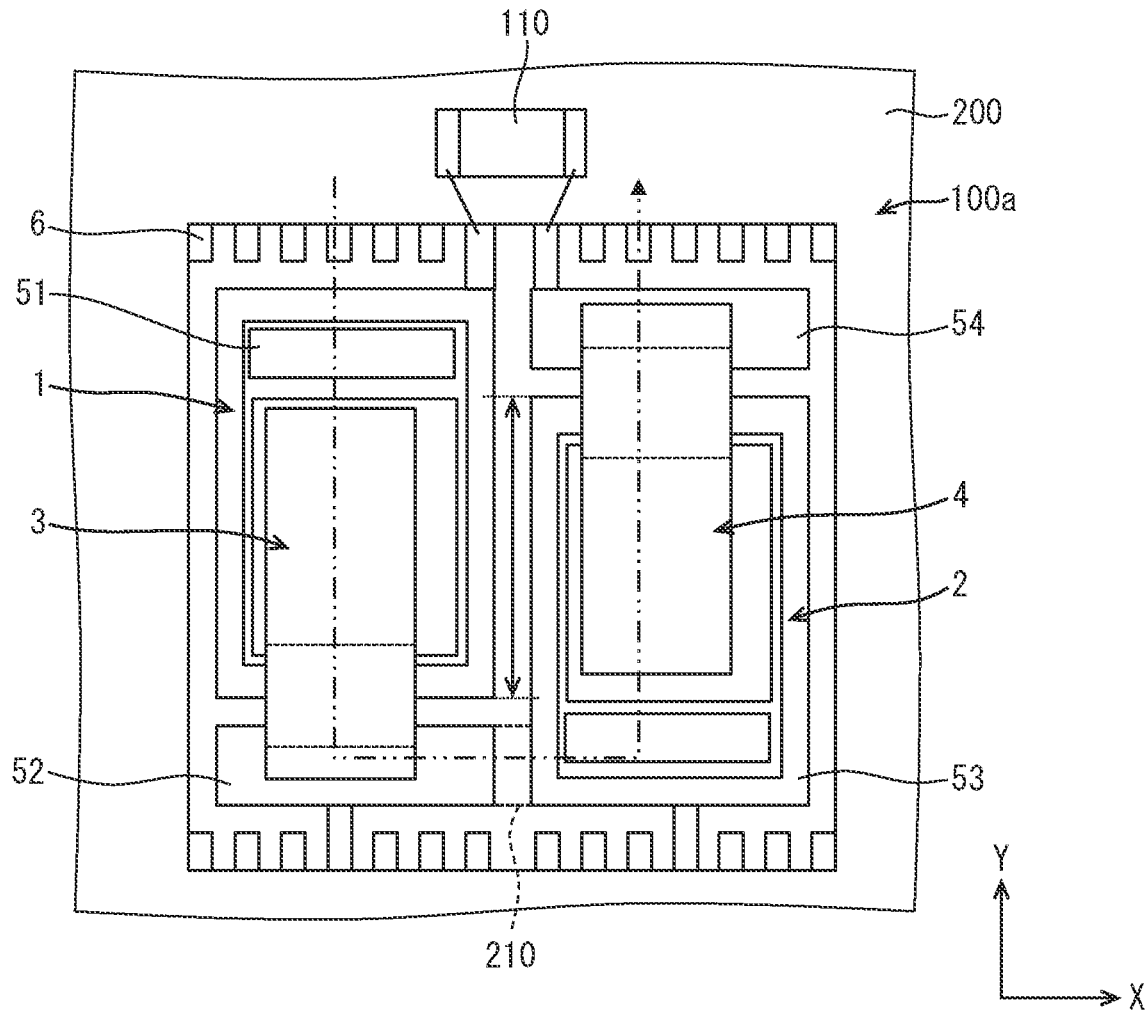
FIG. 4 is a plan view showing an example of a mounting structure of the semiconductor device according to the first embodiment.
Figure 5:
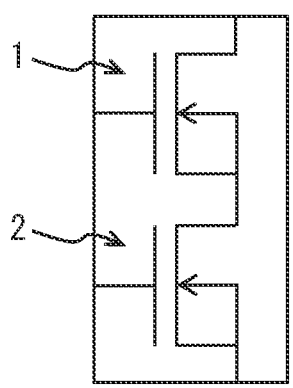
FIG. 5 is an equivalent circuit of the semiconductor device in the mounting structure shown in FIG. 4.
Figure 8A:
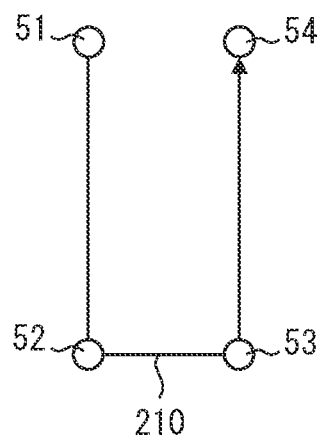
FIG. 8A is an image diagram showing a wiring pattern of terminals in an inverter configuration device according to the first embodiment.
Figure 19:
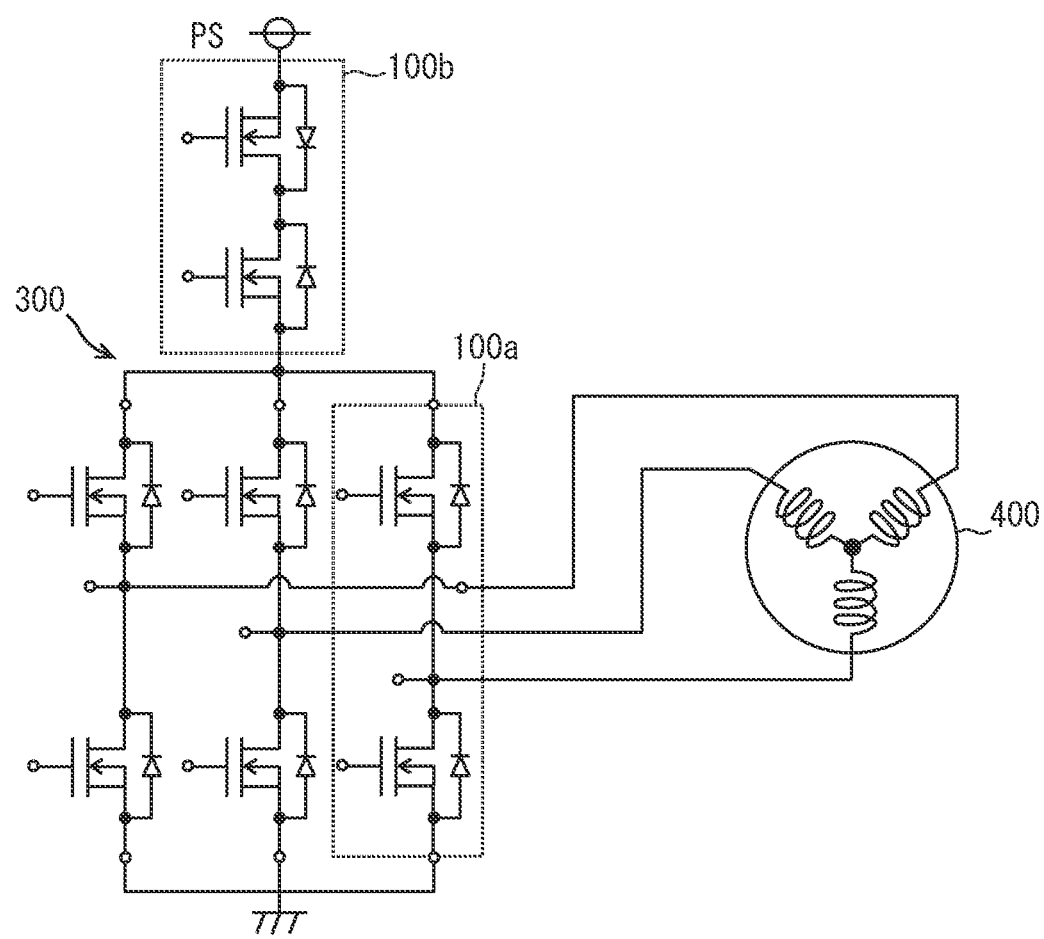
FIG. 19 is a circuit diagram showing an application example of a semiconductor device according to a fourth embodiment.

As shown in FIG. 4, the inverter configuration device 100a is mounted on the printed circuit board 200, and the first source terminal 52 and the second drain terminal 53 are electrically connected via the first wire 210. As a result, in the inverter configuration device 100a, the terminals 51 to 54 are connected as shown in FIG. 8A. Then, as shown in FIG. 5, the first semiconductor element 1 and the second semiconductor element 2 function as switching elements for an inverter. Further, the terminal 52 and the terminal 53 are connected to a motor as shown in FIG. 19, and a current flows through the inverter configuration device 100a as shown by the long dashed double-dotted line in FIG. 4. However, the current does not flow in the first semiconductor element 1 and the second semiconductor element 2 at the same time, and the current flows in each of the first semiconductor element 1 and the second semiconductor element 2 through another inverter configuration device 100a at s timing corresponding to a rotation of the motor.

Further, in the inverter configuration device 100a, the portion protruding from the first drain terminal 51 and the portion protruding from the second source terminal 54 are connected to the capacitor 110 by wires or the like. The inverter configuration devices 100a has the alternate arrangement as described above. Therefore, in the inverter configuration device 100a, the first drain terminal 51 and the second source terminal 54 can be arranged closer to each other than when they are not arranged alternately. That is, in the inverter configuration device 100a, the first drain terminal 51 and the second source terminal 54 can be arranged close to each other while maintaining the planar mounting. In the inverter configuration device 100a, the second drain terminal 53 and the first source terminal 52 can be arranged similarly.

Therefore, in the inverter configuration device 100a, the capacitor 110 can be arranged at a position close to both the first drain terminal 51 and the second source terminal 54. That is, in the inverter configuration device 100a, the distance between the first drain terminal 51 and the second source terminal 54 and the capacitor 110 can be closer than when they are not arranged alternately. As a result, the inverter configuration device 100a can reduce the parasitic inductance due to wiring, improve the switching speed of each of the semiconductor elements 1 and 2, and reduce the switching loss of each of the semiconductor elements 1 and 2.

Next, a case where the semiconductor device 100 is used as a relay configuration device 100b will be described with reference to FIGS. 6 and 7. The relay configuration device 100b has a structure similar to the semiconductor device 100.

Figure 6:
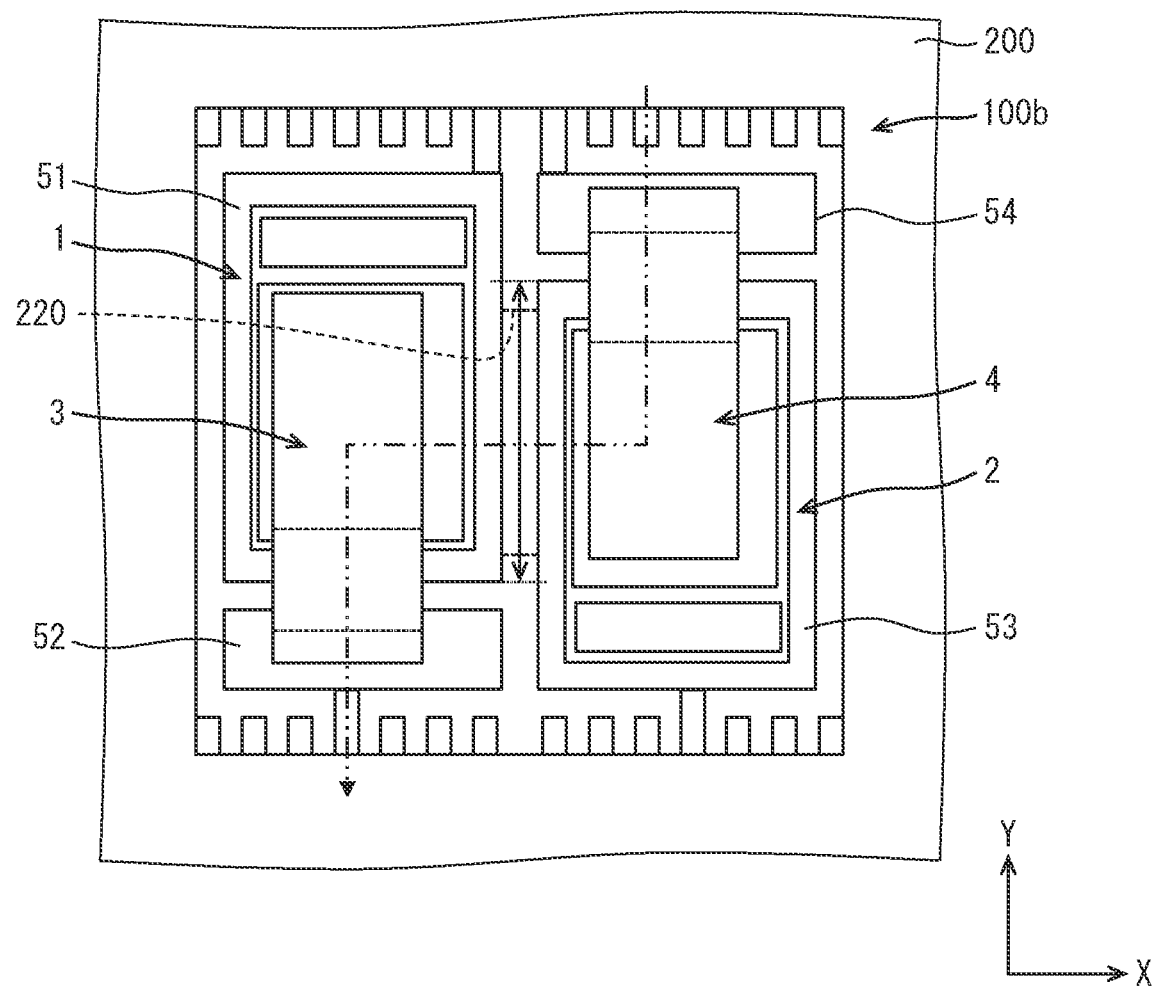
FIG. 6 is a plan view showing another example of a mounting structure of the semiconductor device according to the first embodiment.
Figure 7:
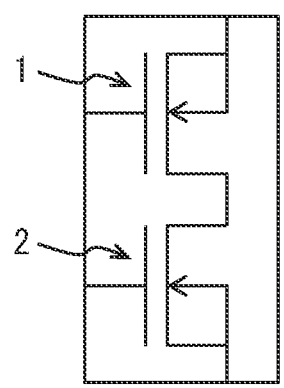
FIG. 7 is an equivalent circuit of the semiconductor device in the mounting structure shown in FIG. 6.
Figure 8B:
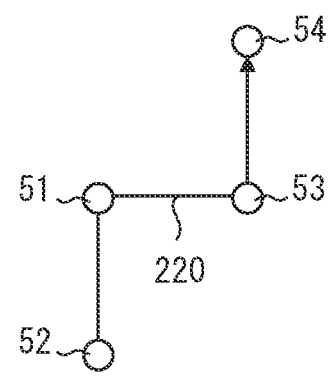
FIG. 8B is an image diagram showing a wiring pattern of terminals in a relay configuration device according to the first embodiment.

As shown in FIG. 6, the relay configuration device 100b is mounted on the printed circuit board 200, and the first source terminal 52 and the second drain terminal 53 are electrically connected via the first wire 210. Accordingly, in the relay configuration device 100b, the terminal 51 to 54 are connected as shown in FIG. 8B. Then, as shown in FIG. 7, the first semiconductor element 1 and the second semiconductor element 2 function as switching elements of a semiconductor relay. In the relay configuration device 100b, a current flows as shown by the long dashed double-dotted line in FIG. 6. However, the relay configuration device 100b can also be configured so that a current flows in the direction opposite to the long dashed double-dotted line in FIG. 6.

The first embodiment of the present disclosure has been described above. However, the present disclosure is not limited to the above-described embodiment in any manner, and various modifications are possible within a scope that does not depart from the gist of the present disclosure. Hereinafter, as other embodiments of the present disclosure, second to fifth embodiments and first to third modification will be described. The above-described embodiment, the second to fifth embodiments, and the first to third modifications can be carried out individually, but can also be carried out in combination as appropriate. The present disclosure can be performed by various combinations without being limited to the combination described in the embodiments.

(First Modification)

Figure 9:
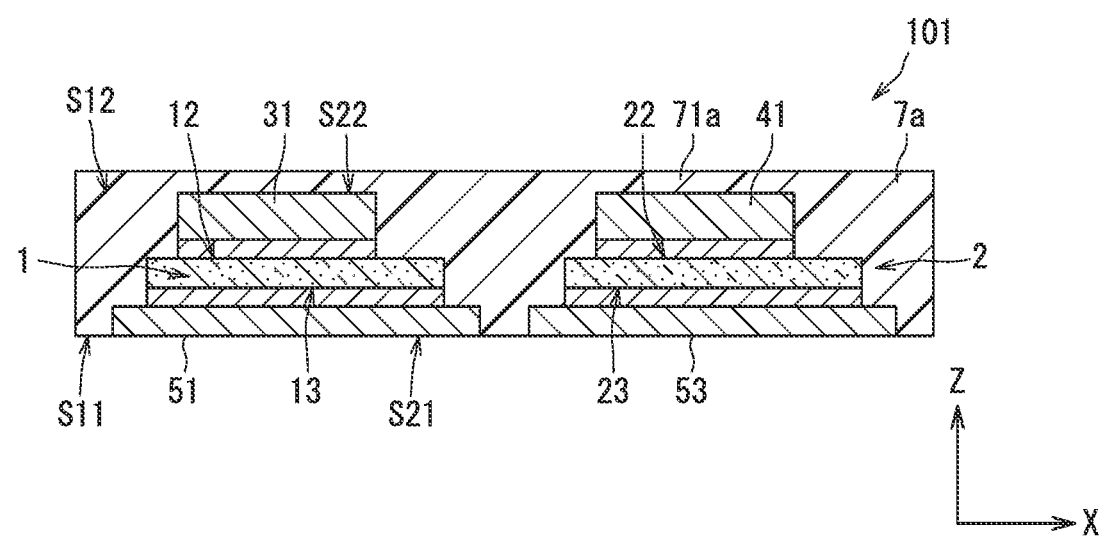
FIG. 9 is a cross-sectional view of a semiconductor device according to a first modification.

A semiconductor device 101 according to the first modification will be described with reference to FIG. 9. Here, the differences between the semiconductor device 101 and the semiconductor device 100 will be mainly described. The semiconductor device 101 is different from the semiconductor device 100 in a configuration of a sealing resin portion 7a. In the semiconductor device 101, the same reference numerals are given to the same components as those of the semiconductor device 100. Therefore, the components having the same reference numerals can be applied with reference to the above embodiment. The cross-sectional view of FIG. 9 corresponds to the cross-sectional view of FIG. 3.

The sealing resin portion 7a is made of a material similar to the sealing resin portion 7. However, as shown in FIG. 9, the sealing resin portion 7a has a surface layer resin portion 71a formed above the clips 3 and 4. That is, in the semiconductor device 101, the clips 3 and 4 are covered with the sealing resin portion 7a without being exposed from the sealing resin portion 7a. Accordingly, the semiconductor device 101 can secure the electrical insulation of the clips 3 and 4.

The surface layer resin portion 71a has a thickness at least 1 time a particle size of the filler. As a result, the sealing resin portion 7a have the surface layer resin portion 71a containing the filler. That is, the sealing resin portion 7a can secure electrical insulation while maintaining the thermal conductivity of the filler. In other words, the sealing resin portion 7a can secure heat dissipation and electrical insulation.

When the thickness of the surface layer resin portion 71a is about the particle size of the filler, it can be said that one resin layer of the sealing resin portion 7a is formed above the clips 3 and 4. Further, it can be said that the sealing resin portion 7a includes the surface layer resin portion 71a having a thickness of 1 time or more the particle size of the filler.

The surface layer resin portion 71a preferably has a thickness of 0.2 mm or more and 0.6 mm or less. The thickness of the surface layer resin portion 71a is the thickness in the Z direction. The thickness of the surface layer resin portion 71a can be adjusted by adjusting a size of a cavity of a mold.

It is conceivable that the thickness of the surface layer resin portion 71a varies depending on a tolerance of a shape and a thickness the clips 3 and 4, a tolerance of solder formed on both sides of the semiconductor elements 1 and 2, and a tolerance of a plate thickness of the lead frame. The inventors examined the thickness of the surface layer resin portion 71a in consideration of these tolerances and the process capability when molding the sealing resin portion 7a. Then, the inventors could obtain the result that the thickness of the surface layer resin portion 71a is preferably 0.4 mm±0.2 mm. That is, in the semiconductor device 100, by setting the thickness of the surface layer resin portion 71a to 0.4 mm 0.2 mm, it is easy to form the surface layer resin portion 71a containing the filler, and heat dissipation and electrical insulation can be ensured.

As described above, since the semiconductor device 101 is covered with the sealing resin portion 7a without exposing the clips 3 and 4, electrical insulation can be ensured. Further, since the semiconductor device 101 has a thermal conductivity of 2.2 W or more in the sealing resin portion 7a, heat dissipation can be ensured. That is, the semiconductor device 101 can secure electrical insulation and heat dissipation without providing an electrically insulating heat dissipation gel or the like on the clips 3 and 4. In other words, the semiconductor device 101 can secure electrical insulation and heat dissipation without additional component. Therefore, the semiconductor device 101 does not need to guarantee electrical insulation and heat dissipation on a user side such as a delivery destination. The semiconductor device 101 can have effects similar to the semiconductor device 100.

Second Embodiment

A semiconductor device 102 of the second embodiment will be described with reference to FIGS. 10 to 14. Here, the differences between the semiconductor device 102 and the semiconductor device 100 will be mainly described. The semiconductor device 102 is different from the semiconductor device 100 in that an application specific integrated circuit (ASIC) 9 is provided. In the semiconductor device 102, the same reference numerals are given to the same components as those of the semiconductor device 100. Therefore, the components having the same reference numerals can be applied with reference to the above embodiment.

In the present embodiment, the shapes of the terminals 51 to 54 and the shapes of the clips 3 and 4 are different from those of the above embodiment, but they are not essential differences. Therefore, in the present embodiment, the same reference numerals as those in the above-described embodiment are given for convenience.

Figure 10:
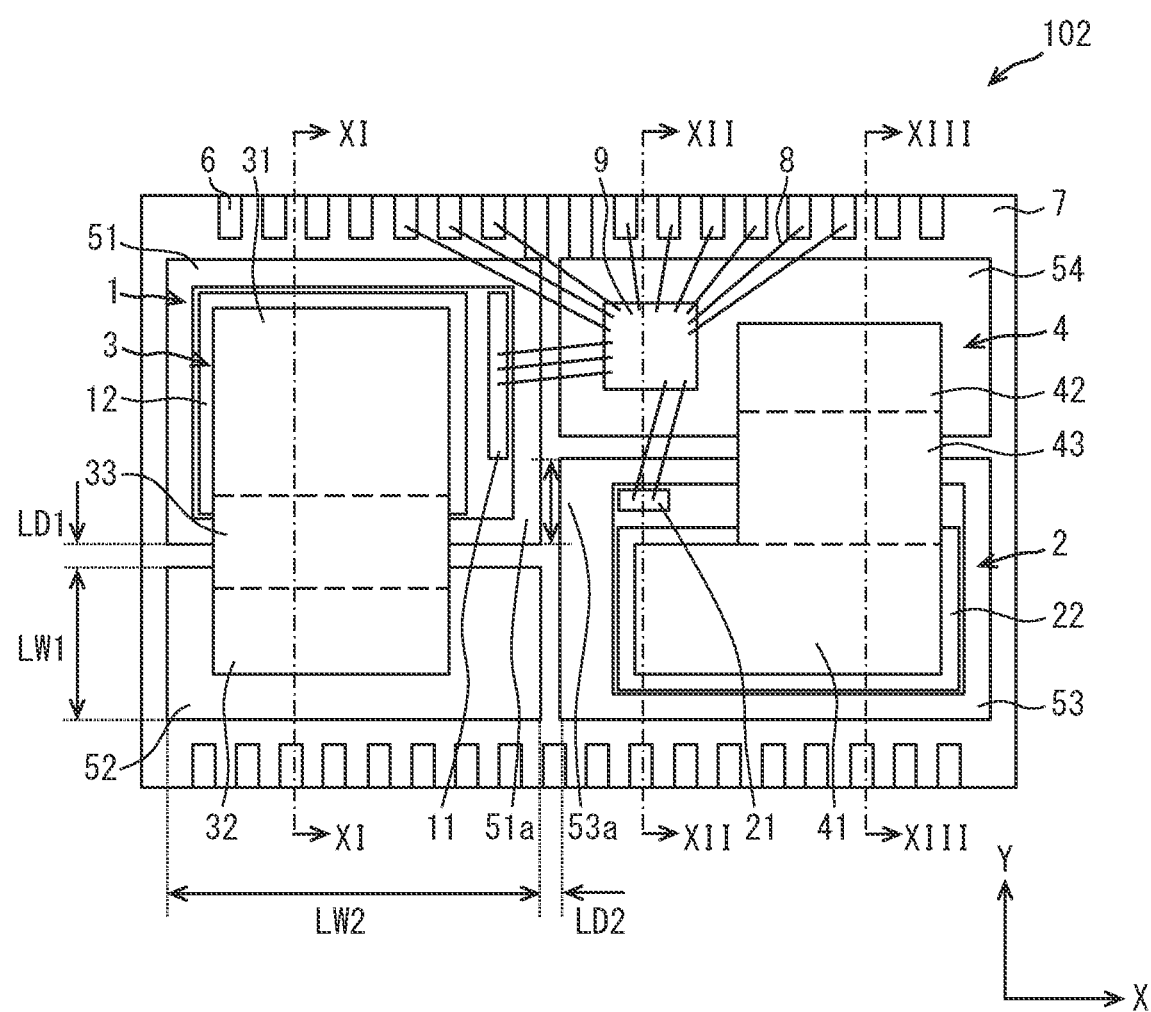
FIG. 10 is a plan view showing a schematic configuration of a semiconductor device according to a second embodiment.
Figure 11:
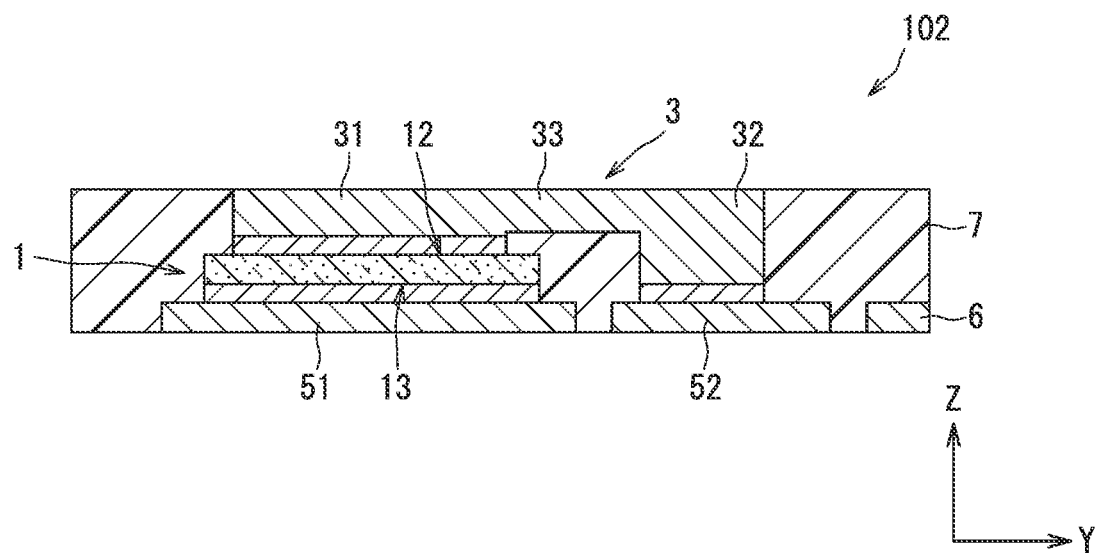
FIG. 11 is a cross-sectional view of the semiconductor device taken along line XI-XI in FIG. 10.
Figure 12:
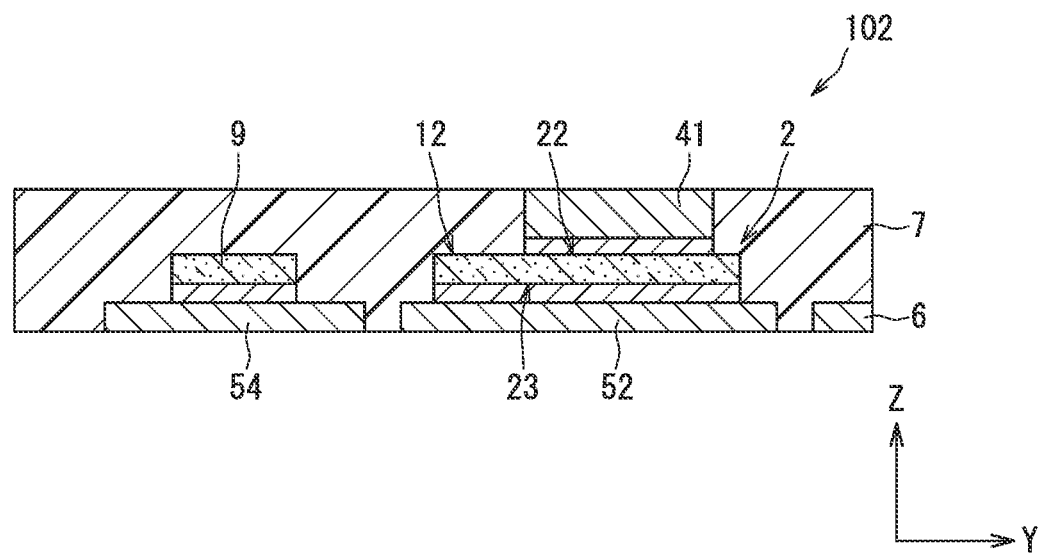
FIG. 12 is a cross-sectional view of the semiconductor device taken along line XII-XII in FIG. 10.
Figure 13:
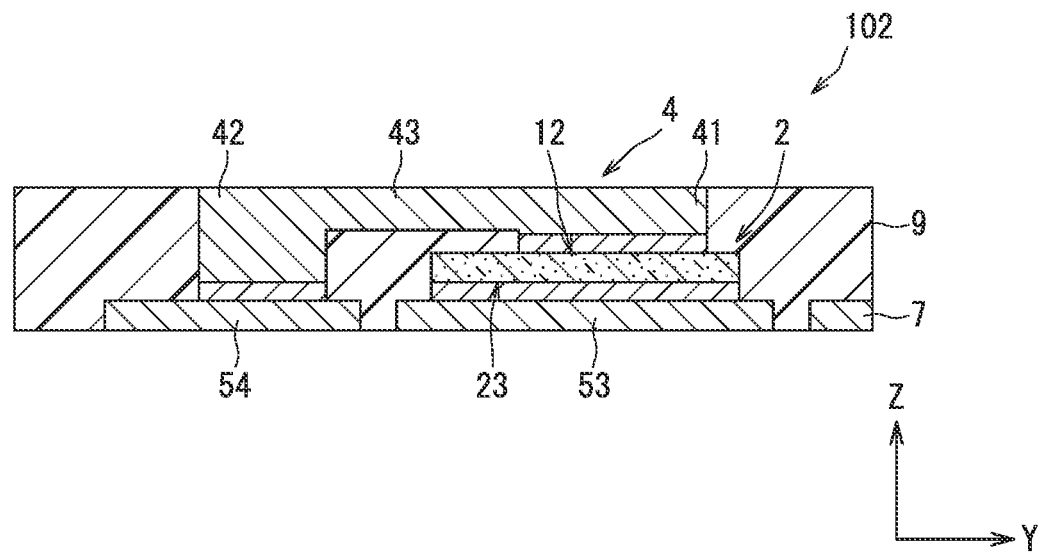
FIG. 13 is a cross-sectional view of the semiconductor device taken along line XIII-XIII in FIG. 10.

As shown in FIGS. 11 and 13, the semiconductor device 102 is configured in a manner similar to the semiconductor device 100. However, as shown in FIGS. 10 and 12, in the semiconductor device 102, the ASIC 9 is mounted above the second source terminal 54.

Figure 14:
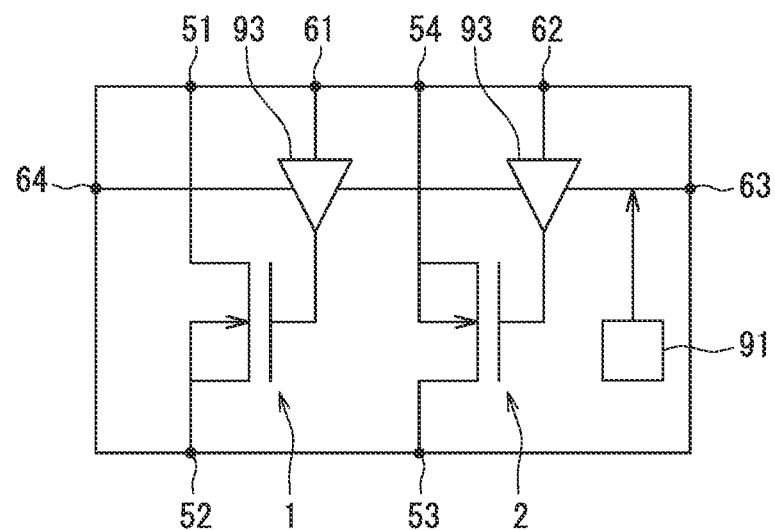
FIG. 14 is an equivalent circuit of the semiconductor device according to the second embodiment.

As shown in FIG. 14, the semiconductor device 102 includes a first input terminal 61, a second input terminal 62, a power supply terminal 63, and a ground terminal 64 as external connection terminals 6. Further, the semiconductor device 102 includes a charge pump circuit (CP) 91 that supplies power to a drive circuit 93 described later. The charge pump circuit 91 is separated from a power supply (PS) supplied to each of the terminal 51 to 54. That is, the power supply for the drive circuit 93 is separated from the power supply for the terminals 51 to 54. The charge pump circuit 91 corresponds to a power supply for the drive circuit. In FIG. 14, a reference numeral 93 is assigned to the drive circuit configured in the ASIC 9.

In the ASIC 9, a circuit for driving each of the semiconductor elements 1 and 2 is formed. The ASIC 9 is mounted above the second source terminal 54. The ASIC 9 is connected to the second source terminal 54 via a silver paste. The ASIC 9 may be mounted collectively with the semiconductor elements 1 and 2, or may be mounted at different timings from the semiconductor elements 1 and 2.

As described above, a rear surface of the ASIC 9 is connected to the second source terminal 54 by the silver paste, so that the ASIC 9 is grounded. Since the ASIC 9 does not carry a large current, the ASIC 9 may be connected to the second source terminal 54 with the silver paste that does not have a low resistance like solder.

However, the ASIC 9 may be connected to the second source terminal 54 by solder instead of the silver paste. In this case, it is necessary to form a plating such as nickel on the rear surface of the ASIC 9.

As shown in FIGS. 10 and 14, the ASIC 9 is connected to the first input terminal 61, the second input terminal 62, the power supply terminal 63, the ground terminal 64, and the gate electrodes 11 and 21 via the wire 8. Accordingly, the ASIC 9 can be electrically connected to an external device provided outside the semiconductor device 102.

As described above, aluminum, copper, gold, or the like can be used for the wire 8. Also, in the present disclosure, a clip may be adopted instead of the wire 8.

The drive circuit 93 operates at a voltage in which the voltage of the power supply terminal 63 is boosted by the charge pump circuit 91 (power supply circuit). Further, the drive circuit 93 applies a gate signal to the first semiconductor element 1 in response to the signal input from the first input terminal 61. Similarly, the drive circuit 93 applies a gate signal to the second semiconductor element 2 in response to the signal input from the second input terminal 62.

Each of the semiconductor element 1 and 2 may be provided with a sense MOS or a temperature-sensitive diode. In this case, the ASIC 9 receives signals from the sense MOS or the temperature sensitive diode via the wire 8.

Further, the charge pump circuit 91 may be built in the ASIC 9. Accordingly, the semiconductor device 102 does not need to add a power supply IC according to the usage environment.

The semiconductor device 102 can have effects similar to those of the semiconductor device 100. Further, since the semiconductor device 102 is provided with the ASIC 9, the semiconductor device 102 can be used regardless of whether it is on the high side or the low side. Thus, the semiconductor device 102 can be standardized. Therefore, the semiconductor device 102 does not need to use a dedicated drive IC or a dedicated drive IC depending on the usage environment, the development period can be shortened, and the resource cost can be reduced. The semiconductor device 102 may also adopt the surface layer resin portion 71*a* of the first modification.

The mounting location of the ASIC 9 is not limited to the above example. The ASIC 9 can be mounted above the first drain terminal 51, above the second clip 4, above the second source electrode 22 of the second semiconductor element 2, or any other place where the potential fluctuation is small.

(Second Modification)

A semiconductor device 103 of the second modification will be described with reference to FIG. 15 and FIGS. 16A to 16C. Here, the differences between the semiconductor device 103 and the semiconductor device 102 will be mainly described. The semiconductor device 103 differs from the semiconductor device 102 in that a capacitor 110 is connected. In the semiconductor device 103, the same reference numerals are given to the same components as those of the semiconductor device 102. Therefore, the components having the same reference numerals can be applied with reference to the above embodiment. In FIGS. 16A to 16C, the semiconductor device 103 is shown by the dashed line.

Figure 15:
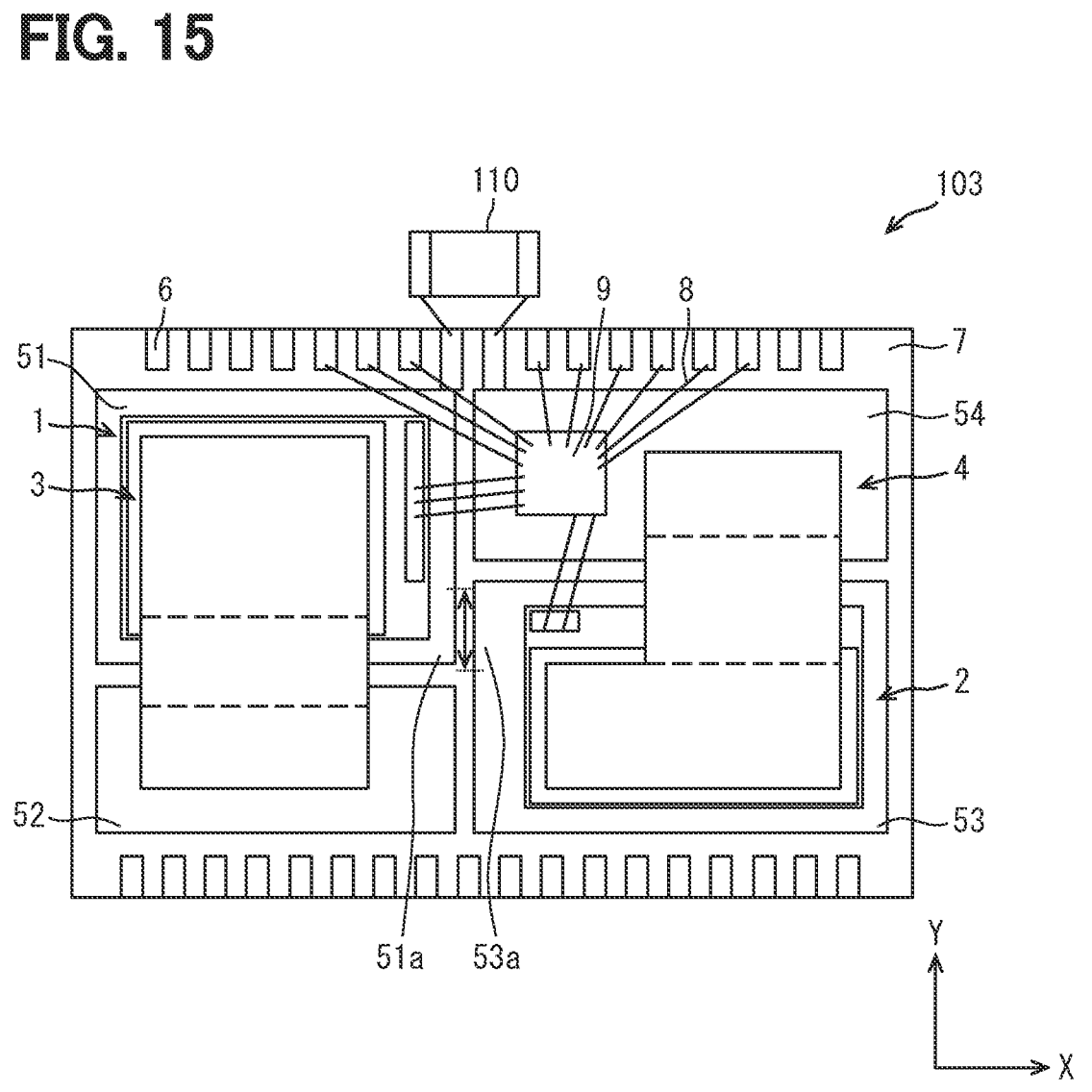

As shown in FIG. 15, the semiconductor device 103 is connected to the capacitor 110 in a manner similar to the inverter configuration device 100*a*. Further, the semiconductor device 103 is mounted on the printed circuit board 200 in a manner similar to the inverter configuration device 100*a*. Therefore, the electronic device includes the printed circuit board 200 on which the semiconductor device 103 and the capacitor 110 are mounted. As described above, when the semiconductor device 103 is used as an inverter configuration device, effects similar to those described above can be obtained by connecting the capacitor 110.

As shown in FIG. 15 and FIGS. 16A to 16C, the semiconductor device 103 includes the ASIC 9 including the drive circuit in a manner similar to the semiconductor device 102. FIG. 16A shows an example in which the semiconductor device 103 is applied to an inverter configuration device and has a power supply terminal for the ASIC 9. In this case, the power supply terminal of the ASIC 9 is connected to a boot strap circuit 92. As a result, the semiconductor device 103 can cope with the bootstrap circuit 92. That is, the ASIC 9 can obtain an external power supply.

FIG. 16B shows an example in which the semiconductor device 103 is applied to an inverter configuration device and is provided with the charge pump circuit 91. The charge pump circuit 91 may be built in the ASIC 9. Since the semiconductor device 103 of this example requires low voltage operation (startability) as in a vehicle, it can be said that the semiconductor device 103 has the built-in ASIC 9 provided with the charge pump circuit 91.

FIG. 16C shows an example in which the semiconductor device 103 is applied to a relay configuration device and is provided with the charge pump circuit 91. In FIG. 16C, an example including a temperature terminal 65 connected to a temperature sensor is adopted. Since the semiconductor device 103 of this example needs to hold the MOS on, the charge pump circuit 91 is required.

The semiconductor device 103 can have effects similar to those of the semiconductor device 102. Further, by sharing a charge pump power output with a cathode side of a diode of the external bootstrap circuit 92, the semiconductor device 103 can acquire power from the built-in charge pump circuit 91 or the external bootstrap circuit 92, and free gate drive becomes possible.

Third Embodiment

A semiconductor device 104 of the third embodiment will be described with reference to FIG. 17 and FIGS. 18A and 18B. Here, the differences between the semiconductor device 104 and the semiconductor device 100 will be mainly described. In the semiconductor device 104, the orientations of the first terminals 51 and 52 and the second terminals 53 and 54 are different from those of the semiconductor device 100. In the semiconductor device 104, the same reference numerals are given to the same components as those of the semiconductor device 100. Therefore, the components having the same reference numerals can be applied with reference to the above embodiment.

Figure 17:
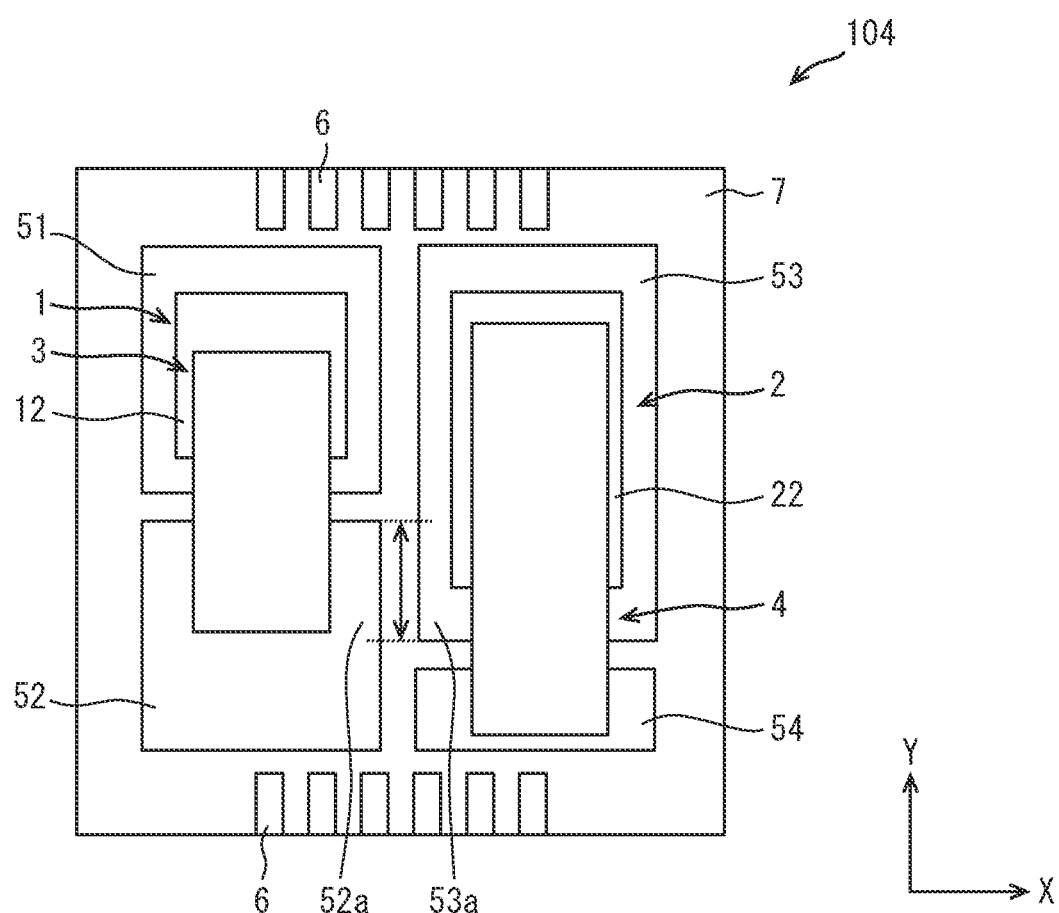
FIG. 17 is a plan view showing a schematic configuration of a semiconductor device according to a third embodiment.

As shown in FIG. 17, in the semiconductor device 104, the first drain terminal 51 and the second drain terminal 53 are arranged adjacent to each other in the X direction. Further, in the semiconductor device 104, the first source terminal 52 and the second source terminal 54 are arranged adjacent to each other in the X direction. In this way, in the semiconductor device 104, the arrangement direction of the first drain terminal 51 and the first source terminal 52 for the first semiconductor element 1 and the arrangement direction of the second drain terminal 53 and the second source terminal 54 for the second semiconductor element 2 are the same.

Further, the first source terminal 52 is arranged adjacent to both the second drain terminal 53 and the second source terminal 54 in the X direction. Further, the second drain terminal 53 is arranged adjacent to both the first drain terminal 51 and the first source terminal 52 in the X direction. Therefore, the second drain terminal 53 has a second overlap portion 53a facing the first source terminal 52. On the other hand, the first source terminal 52 has a third overlap portion 52a facing the second drain terminal 53.

Figure 18A:
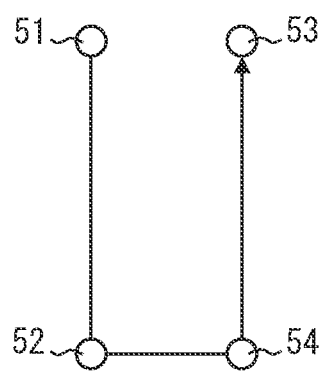
FIG. 18A is an image diagram showing a wiring pattern of terminals in an inverter configuration device according to the third embodiment.
Figure 18B:
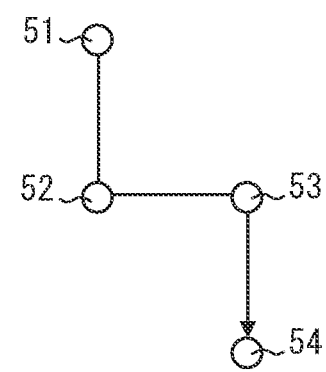
FIG. 18B is an image diagram showing a wiring pattern of terminals in a relay configuration device according to the third embodiment.

As shown in FIG. 18A and FIG. 18B, the semiconductor device 104 can be the inverter configuration device 100a or the relay configuration device 100b by connecting the terminals with the wiring of the printed circuit board 200 in a manner similar to the first embodiment. The inverter configuration device 100a is configured by connecting the first source terminal 52 and the second drain terminal 53 with wiring, as shown in FIG. 18A. On the other hand, the relay configuration device 100b is configured by connecting the first source terminal 52 and the second source terminal 54 by wiring, as shown in FIG. 18B.

The semiconductor device 104 can have effects similar to those of the semiconductor device 100.

Fourth Embodiment

Semiconductor devices 100a and 100b according to the fourth embodiment will be described with reference to FIG. 19. The present embodiment adopts an example in which two types of semiconductor devices 100a and 100b are applied to an electric power steering system (EPS system). FIG. 19 is a circuit of a power part of the EPS system.

The EPS system includes a three-phase motor 400. Further, the EPS system includes the relay configuration device 100b used as a power supply relay and a reverse connection prevention relay, and the inverter configuration device 100a used as a half bridge of an inverter 300. That is, the EPS system includes the semiconductor device 100 used as the power supply relay and the reverse connection prevention relay, and the semiconductor device 100 used as the half bridge of the inverter 300.

The power relay is a function of stopping the power supply to the EPS circuit and the motor 400 when the EPS is stopped or when an abnormality occurs. The reverse connection prevention relay is a function to prevent the current from flowing through a built-in diode in the power supply relay when a vehicle battery is reversely connected.

The inverter 300 is provided three inverter configuration devices 100a which are half bridges, and each of the inverter configuration devices 100a is connected to a motor terminal. That is, the inverter 300 is provided with the inverter configuration devices 100a respectively for a U phase, a V phase, and a W phase of the motor 400. The inverter 300 rotates the motor 400 by turning on and off the semiconductor elements 1 and 2 in each of the inverter configuration devices 100a.

The EPS system requires a drive circuit to drive the inverter configuration devices 100a. The drive circuit may be built in the ASIC 9 in a manner similar to the above embodiment. The ASIC 9 may be mounted in a package common to the semiconductor elements 1 and 2, or may be separately configured externally. Further, the EPS system requires a power supply having a voltage higher than the power supply voltage in order to drive the high-side semiconductor elements 1 and 2. Therefore, in the EPS system, the charge pump circuit 91 and the bootstrap circuit are used as in the above embodiment.

The inverter configuration device 100a and the relay configuration device 100b can have effects similar to those of the semiconductor device 100. Further, in the present embodiment, the same package (semiconductor device 100) can be used for the inverter configuration device 100a and the relay configuration device 100b. Since the semiconductor device 100 can be commonly used for different functions in this way, the development efficiency and the production efficiency can be improved.

Fifth Embodiment

A semiconductor device 105 according to a fifth embodiment will be described with reference to FIGS. 20 and 21. Here, the differences between the semiconductor device 105 and the semiconductor device 101 will be mainly described. The semiconductor device 105 differs from the semiconductor device 101 in the configurations of the first terminals 51b and 52b and the second terminals 53b and 54b. In the semiconductor device 105, the same reference numerals are given to the same components as those of the semiconductor device 101. Therefore, the components having the same reference numerals can be applied with reference to the above embodiment.

Figure 20:
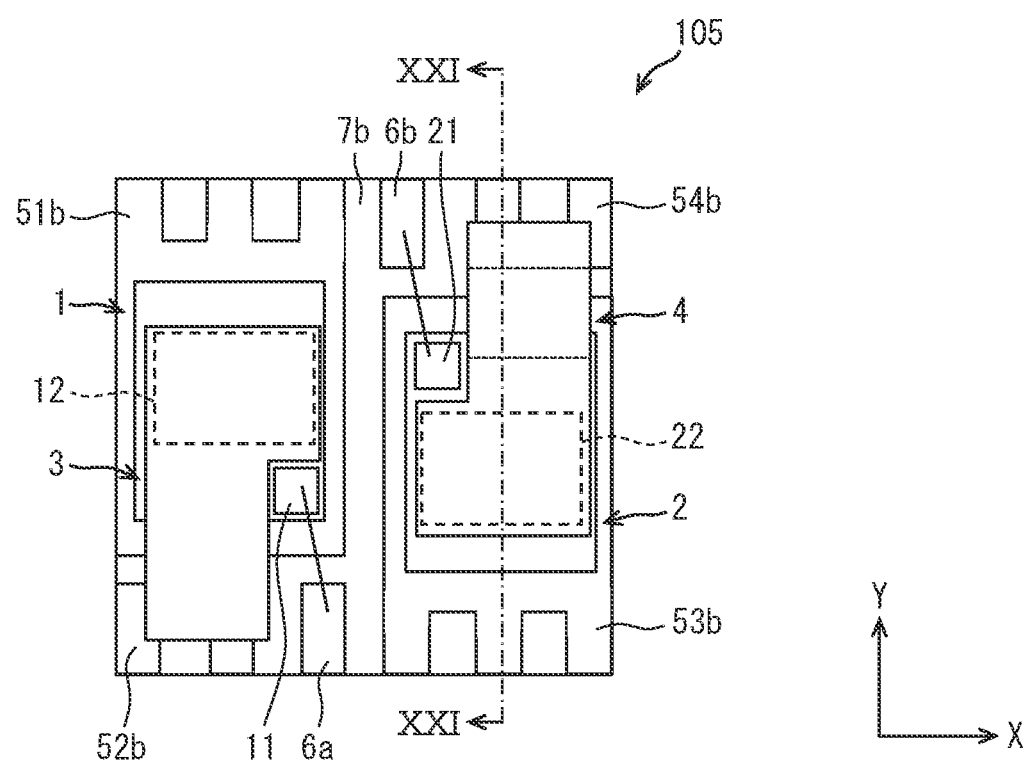
FIG. 20 is a plan view showing a schematic configuration of a semiconductor device according to a fifth embodiment.

As shown in FIG. 20, the first lead frame includes a first gate terminal 6a, a first drain terminal 51b, and a first source terminal 52b. The first drain terminal 51b includes a first portion on which the first semiconductor element 1 is mounted and a second portion protruding from the first portion. Therefore, the first drain terminal 51b can be regarded as a configuration in which the first drain terminal 51 and the external connection terminal 6 are integrated.

The first source terminal 52b is composed of multiple members. That is, the first source terminal 52b can be regarded as having a configuration including multiple external connection terminals 6. The first gate terminal 6a is one of the external connection terminals 6.

The second lead frame includes a second gate terminal 6b, a second drain terminal 53b, and a second source terminal 54b. Each terminal 6b, 53b, 54b is the same as each terminal 6b, 51b, 52b.

Figure 21:
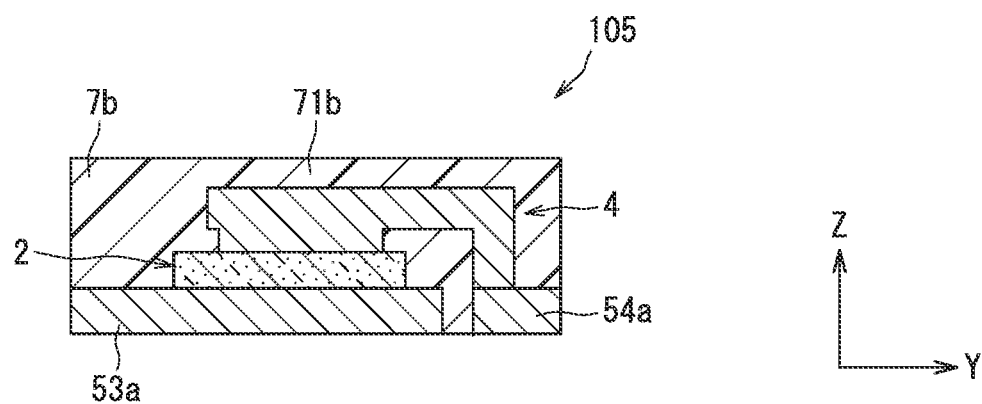
FIG. 21 is a cross-sectional view of the semiconductor device taken along line XXI-XXI of FIG. 20.

As shown in FIG. 21, the sealing resin portion 7b has a surface layer resin portion 71b, similarly to the sealing resin portion 7a. The surface layer resin portion 71b corresponds to the surface layer resin portion 71a.

The semiconductor device 105 can have effects similar to those of the semiconductor device 101. The configuration of the present embodiment can be applied to other embodiments.

Normally, a solder connection portion connecting a printed circuit board and a semiconductor device is damaged from an outer terminal because stress such as a temperature cycle is strongly applied to the outer terminal. That is, the life of the solder connection portion is shorter at the outer terminal than at the inner terminal. The semiconductor device cannot be electrically bonded between a terminal having a damaged solder joint and the printed circuit board. In this case, the semiconductor device may not operate.

In the semiconductor device 105, the gate terminals 6a and 6b are arranged inside. Therefore, the semiconductor device 105 is less affected by damage due to the solder life at the gate terminals 6a and 6b, and the reliability is improved. Further, even if the semiconductor device 105 has a terminal different from the gate terminals 6a and 6b, the same effect can be obtained by arranging only one terminal inside. The outside is an end in the X direction. The inside is a place that is not the end in the X direction.

Further, in the semiconductor device 105, the drain terminals 51b and 53b and the source terminals 52b and 54b are also arranged on the outside. However, since the drain terminals 51b and 53b and the source terminals 52b and 54b are also arranged inside the semiconductor device 105, the semiconductor device 105 operates normally even if the outer terminals are damaged.

(Reference Example)

Figure 22:
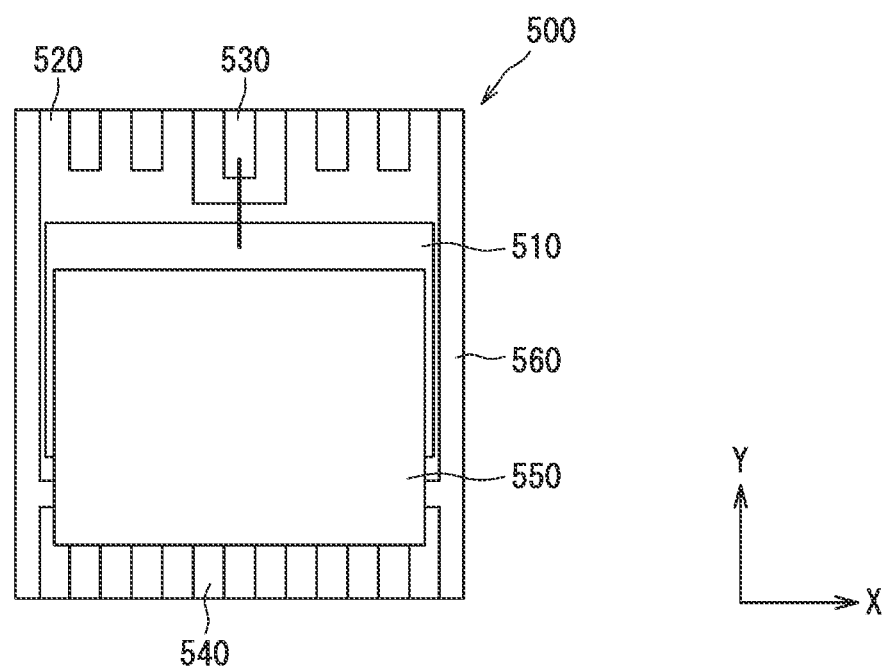
FIG. 22 is a plan view showing a schematic configuration of a semiconductor device according to a reference example.

FIG. 22 shows a semiconductor device 500 according to a reference example. The semiconductor device 500 includes one semiconductor element 510, a drain terminal 520, a gate terminal 530, a source terminal 540, a clip 550, and a sealing resin portion 560. The semiconductor device 500 has a gate terminal 530 arranged inside in a manner similar to the semiconductor device 105. Therefore, the semiconductor device 500 is less affected by damage due to the solder life at the gate terminal 530, and the reliability is improved in a manner similar to the semiconductor device 105. Further, since the semiconductor device 500 is arranged in the same manner as the semiconductor device 105 with respect to the drain terminal 520 and the source terminal 540, the same effect as that of the semiconductor device 105 can be obtained.

(Third Modification)

Figure 23:
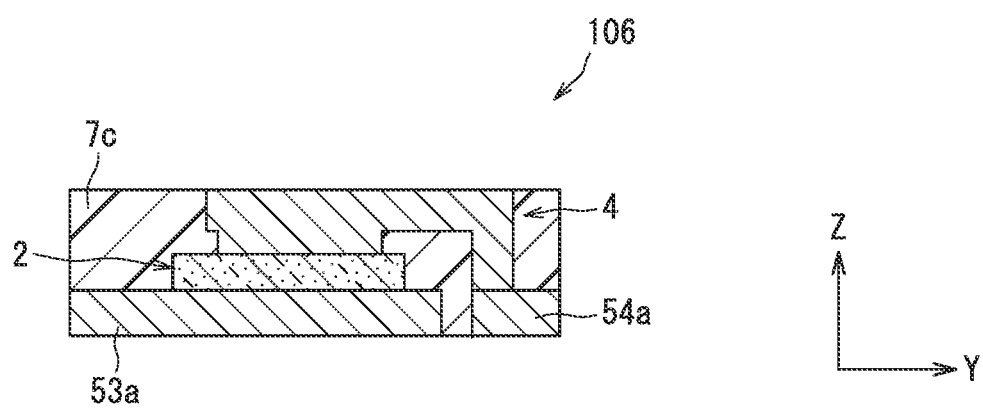
FIG. 23 is a cross-sectional view of a semiconductor device according to a third modification.

A semiconductor device 101 according to the third modification will be described with reference to FIG. 23. Here, the differences between the semiconductor device 106 and the semiconductor device 105 will be mainly described. The semiconductor device 106 differs from the semiconductor device 105 in the configuration of a sealing resin portion 7c. In the semiconductor device 106, the same reference numerals are given to the same components as those of the semiconductor device 105. Therefore, the components having the same reference numerals can be applied with reference to the above embodiment. FIG. 23 is a cross-sectional view corresponding to FIG. 21.

The semiconductor device 106 includes the sealing resin portion 7c. The sealing resin portion 7c is provided in a state where the surface of the second clip 4 opposite to the surface facing the second semiconductor element 2 is exposed in a manner similar to the sealing resin portion 7. Furthermore, the sealing resin portion 7c is provided in a state where the surface of the first clip 3 opposite to the surface facing the first semiconductor element 1 is exposed. The semiconductor device 106 can have effects similar to those of the semiconductor device 105.

What is claimed is:

1. A semiconductor device configured to be mountable on a wiring board having wiring, the semiconductor device comprising:
   a first semiconductor element having two electrodes respectively disposed on two surfaces of the first semiconductor element;
   a second semiconductor element having two electrodes respectively disposed on two surfaces of the second semiconductor element;
   two first terminals configured to be connected to a part of the wiring in a state of being mounted on the wiring board, electrically connected to the two electrodes of the first semiconductor element, respectively, and arranged side by side in one direction;
   two second terminals configured to be connected to another part of the wiring in the state of being mounted on the wiring board, electrically connected to the two electrodes of the second semiconductor element, respectively, arranged side by side in the one direction to be adjacent to the two first terminals; and
   a sealing resin portion covering the first semiconductor element, the second semiconductor element, the first terminals, and the second terminals in a state where facing surfaces of the first terminals and the second terminals are exposed from the sealing resin portion, the facing surfaces of the first terminals and the second terminals face the wiring board in the state of being mounted on the wiring board, wherein
   the facing surfaces of the two first terminals have area ratios different from each other,
   the facing surfaces of the two second terminals have area ratios different from each other, and
   one of the first terminals is arranged adjacent to both the two second terminals.

2. The semiconductor device according to claim 1, wherein
   a distance between the two first terminals is narrower than a width of each of the two first terminals in the one direction, a distance between the two second terminals is narrower than a width of each of the two second terminals in the one direction, and a distance between the one of the first terminals and the two second terminals is narrower than widths of the first terminals and the second terminals in an arrangement direction in which the first terminals and the second terminals are arranged.

3. The semiconductor device according to claim 1, wherein each of the first semiconductor element and the second semiconductor element has a front surface and a rear surface as the two surfaces and has a front surface electrode disposed on the front surface and a rear surface electrode disposed on the rear surface as the two electrodes, the two first terminals include a first rear surface terminal facing and connected to the rear surface electrode of the first semiconductor element, and a first front surface terminal connected to the front surface electrode of the first semiconductor element via a first bridge member, the two second terminals include a second rear surface terminal facing and connected to the rear surface electrode of the second semiconductor element, and a second front surface terminal connected to the front surface electrode of the second semiconductor element via a second bridge member, and the two first terminals and the two second terminals are arranged in such a manner that the first rear surface terminal and the second front surface terminal are adjacent to each other, and the second rear surface terminal and the first front surface terminal are adjacent to each other.

4. The semiconductor device according to claim 1, wherein each of the first semiconductor element and the second semiconductor element has a front surface and a rear surface as the two surfaces, and has a front surface electrode disposed on the front surface and a rear surface electrode disposed on the rear surface as the two electrodes, the two first terminals include a first rear surface terminal facing and connected to the rear surface electrode of the first semiconductor element, and a first front surface terminal connected to the front surface electrode of the first semiconductor element via a first bridge member, the two second terminals include a second rear surface terminal facing and connected to the rear surface electrode of the second semiconductor element, and a second front surface terminal connected to the front surface electrode of the second semiconductor element via a second bridge member, and the two first terminals and the two second terminals are arranged in such a manner that the first rear surface terminal and the second rear surface terminal are adjacent to each other, and the first front surface terminal and the second front surface terminal are adjacent to each other.

5. The semiconductor device according to claim 3, wherein each of the first bridge member and the second bridge member is a block-shaped member.

6. The semiconductor device according to claim 5, wherein the first bridge member has a facing surface that faces the front surface electrode of the first semiconductor element and the first front surface terminal, and an opposite surface that is opposite from the facing surface and is exposed from the sealing resin portion, and the second bridge member has a facing surface that faces the front surface electrode of the second semiconductor element and the second front surface terminal, and an opposite surface that is opposite from the facing surface and is exposed from the sealing resin portion.

7. The semiconductor device according to claim 1, further comprising a drive circuit configured to drive the first semiconductor element and the second semiconductor element, wherein a power supply for the drive circuit is separated from another power supply that supplies power to the first terminals and the second terminals.

8. The semiconductor device according to claim 7, wherein the power supply for the drive circuit is built in the drive circuit.

9. An electronic device comprising:

a wiring board having wiring; and a semiconductor device mounted on the wiring board and including:

a first semiconductor element having two electrodes respectively disposed on two surfaces of the first semiconductor element;

a second semiconductor element having two electrodes respectively disposed on two surfaces of the second semiconductor element;

two first terminals connected to a part of the wiring of the wiring board, electrically connected to the two electrodes of the first semiconductor element, respectively, and arranged side by side in one direction;

two second terminals connected to another part of the wiring of the wiring board, electrically connected to the two electrodes of the second semiconductor element, respectively, and arranged side by side in the one direction to be adjacent to the two first terminals; and a sealing resin portion covering the first semiconductor element, the second semiconductor element, the first terminals, and the second terminals in a state where facing surfaces of the first terminals and the second terminals that face the wiring board are exposed from the sealing resin portion, wherein the facing surfaces of the two first terminals have area ratios different from each other, the facing surfaces of the two second terminals have area ratios different from each other, and one of the first terminals is arranged adjacent to both the two second terminals.

10. An electronic device comprising:

a wiring board having wiring;

a capacitor disposed on the wiring board; and a semiconductor device mounted on the wiring board and including:

a first semiconductor element having a front surface and a rear surface, and having a front surface electrode disposed on the front surface and a rear surface electrode disposed on the rear surface;

a second semiconductor element having a front surface and a rear surface, and having a front surface electrode disposed on the front surface and a rear surface electrode disposed on the rear surface;

a first rear surface terminal facing and connected to the rear surface electrode of the first semiconductor element, and a first front surface terminal connected to the front surface electrode of the first semiconductor element via a first bridge member, the first rear surface terminal and the first front surface terminal connected to a part of the wiring of the wiring board and arranged side by side in one direction;

a second rear surface terminal facing and connected to the rear surface electrode of the second semiconductor element, and a second front surface terminal connected to the front surface electrode of the second semiconductor element via a second bridge member, the second rear surface terminal and the second front surface terminal connected to another part of the wiring of the wiring board and arranged side by side in the one direction; and a sealing resin portion covering the first semiconductor element, the second semiconductor element, the first front surface terminal, the first rear surface terminal, the second front surface terminal, and the second rear surface terminal in a state where facing surfaces of the first front surface terminal, the first rear surface terminal, the second front surface terminal, and the second rear surface terminal that face the wiring board are exposed from the sealing resin portion, wherein the facing surface of the first front surface terminal and the facing surface of the first rear surface terminal have area ratios different from each other, the facing surface of the second front surface terminal and the facing surface of the second rear surface terminal have area ratios different from each other, the first rear surface terminal and the second front surface terminal are arranged adjacent to each other and respectively connected to terminals of the capacitor, the second rear surface terminal and the first front surface terminal are arranged adjacent to each other, and the first front surface terminal or the first rear surface terminal is arranged adjacent to both the second front surface terminal and the second rear surface terminal.

11. The electronic device according to claim 10, further comprising a drive circuit configured to drive the first semiconductor element and the second semiconductor element, wherein a power supply for the drive circuit is separated from another power supply that supplies power to the first front surface terminal, the first rear surface terminal, the second front surface terminal, and the second rear surface terminal.

12. The electronic device according to claim 11, wherein the power supply for the drive circuit is built in the drive circuit.

\* \* \* \* \*